(12) United States Patent
Choi et al.

(10) Patent No.: US 11,140,252 B1
(45) Date of Patent: Oct. 5, 2021

(54) FLEXIBLE DISPLAY DEVICE

(71) Applicant: LG ELECTRONICS INC., Seoul (KR)

(72) Inventors: Hak-Ho Choi, Seoul (KR); Seounghwan Seol, Seoul (KR); Sung Do Kim, Seoul (KR); Sangwook Park, Seoul (KR); Ji Woong Yang, Seoul (KR); Jeeho Yom, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/934,932

(22) Filed: Jul. 21, 2020

(30) Foreign Application Priority Data

Mar. 31, 2020 (WO) ................ PCT/KR2020/004413

(51) Int. Cl.
*H04M 1/02* (2006.01)
*G06F 1/16* (2006.01)
(Continued)

(52) U.S. Cl.
CPC ........ *H04M 1/0268* (2013.01); *G06F 1/1624* (2013.01); *G06F 1/1643* (2013.01);
(Continued)

(58) Field of Classification Search
CPC .... G06F 1/1652; G06F 1/1624; G06F 1/1643; G06F 1/1686; G06F 1/0268; H04M 1/0268
See application file for complete search history.

(56) References Cited

U.S. PATENT DOCUMENTS 8,711,566 B2 * 4/2014 O'Brien ................ G06F 1/1624
 361/724
10,193,095 B2 * 1/2019 Seo ........................ G06F 1/1601
(Continued)

FOREIGN PATENT DOCUMENTS

CN 109618033 4/2019
CN 109819074 5/2019
(Continued)

OTHER PUBLICATIONS

PCT International Application No. PCT/KR2020/004413, International Search Report dated Dec. 24, 2020, 3 pages.
(Continued)

*Primary Examiner* — Nidhi Thaker
(74) *Attorney, Agent, or Firm* — Lee, Hong, Degerman, Kang & Waimey

(57) ABSTRACT

The flexible display device includes a body, a flexible display, and a camera. The body includes a first body and a second body. The second body performs reciprocating movement relative to the first body between a first position and a second position. An area of the flexible display viewed from the front is larger when the second body is at the second position than when the second body is at the first position. When the second body is at the first position, the distance from a support to an edge of a third region is greater than the distance from the support to the camera. Accordingly, a range (stroke) of movement of the second body relative to the first body can be increased. In addition, when the second body is at the second position, the area of the flexible display viewed from the front can be increased.

19 Claims, 25 Drawing Sheets

(51) Int. Cl.
*H05K 5/02* (2006.01)
*H04N 5/225* (2006.01)
*H05K 5/00* (2006.01)

(52) U.S. Cl.
CPC .......... *G06F 1/1652* (2013.01); *G06F 1/1686* (2013.01); *G06F 1/1698* (2013.01); *H04N 5/2253* (2013.01); *H05K 5/0017* (2013.01); *H05K 5/0217* (2013.01)

(56) References Cited

U.S. PATENT DOCUMENTS

| | | | | |
|---|---|---|---|---|
| 10,321,583 | B2 * | 6/2019 | Seo | H05K 5/0017 |
| 10,547,718 | B2 * | 1/2020 | Lee | H04B 1/3888 |
| 10,553,135 | B2 * | 2/2020 | Lee | G09F 9/301 |
| 2006/0166713 | A1 * | 7/2006 | Yeh | G06F 1/1652 |
| | | | | 455/575 |
| 2012/0212433 | A1 * | 8/2012 | Lee | G06F 3/041 |
| | | | | 345/173 |
| 2013/0058063 | A1 * | 3/2013 | O'Brien | G06F 1/1652 |
| | | | | 361/807 |
| 2013/0222293 | A1 * | 8/2013 | Chung | G06F 1/1652 |
| | | | | 345/173 |
| 2017/0364119 | A1 * | 12/2017 | Lee | G06F 1/1652 |
| 2018/0198896 | A1 * | 7/2018 | Kang | G06F 1/1652 |
| 2019/0268455 | A1 * | 8/2019 | Baek | G06F 1/1624 |
| 2019/0305237 | A1 * | 10/2019 | Shin | H01L 51/524 |
| 2019/0310686 | A1 * | 10/2019 | Lee | G06F 1/1688 |

FOREIGN PATENT DOCUMENTS

| | | | | |
|---|---|---|---|---|
| CN | 109819074 A | * | 5/2019 | .......... G06F 1/1652 |
| CN | 110445899 | | 11/2019 | |
| EP | 3258675 | | 12/2017 | |
| KR | 10-1107127 | | 1/2012 | |
| KR | 10-2019-0062855 | | 6/2019 | |
| KR | 10-2019-0086305 | | 7/2019 | |
| KR | 10-2019-0113128 | | 10/2019 | |
| KR | 10-2020-0007366 | | 1/2020 | |
| WO | 2019139371 | | 7/2019 | |

OTHER PUBLICATIONS

European Patent Office Application No. 20185602.8, Search Report dated Mar. 18, 2021, 8 pages.

* cited by examiner

FLEXIBLE DISPLAY DEVICE

CROSS-REFERENCE TO RELATED APPLICATION

Pursuant to 35 U.S.C. § 119, this application claims the benefit of an earlier filing date and right of priority to International Application No. PCT/KR2020/004413, filed on Mar. 31, 2020, the contents of which are hereby incorporated by reference herein in its entirety.

BACKGROUND

1. Technical Field

The present disclosure relates to a display device equipped with a flexible display and a camera.

2. Description of Related Art

With the development of flexible displays that are bendable while displaying image information thereon, studies are being conducted and developments are being made regarding a foldable type device in which a flexible display is applied to a device having two bodies and folding structures (for example, hinge units). In such a device, since the flexible display may be entirely disposed on the two bodies via a folding structure, a large sized display may be implemented in the device.

As another device using a flexible display, a rollable device having a structure in which a display is rolled has been studied and developed. In such a device, as the flexible display is rolled, the total size or area of the display may be reduced. Conversely, as the flexible display is unrolled, the size or area of the display may be increased.

As still another device using a flexible display, a device has been introduced in which, as the two bodies perform sliding movement relative to each other, the flexible display having a U-shape according to a curved middle part is modified such that an area of the display viewed from either side changes.

As one prior document using a flexible display in this regard, Korean Patent Registration No. 1107127 (hereinafter referred to as 'Related Art') discloses a mobile terminal that includes a terminal body, a sliding member, a flexible display, and a rotation axis.

The mobile terminal according to the Related Art may be maintained in a relatively small size in a state in which the sliding member is not withdrawn from the terminal body, but may form a display of a relatively large screen by being maintained in a relatively large size in a state in which the sliding member is withdrawn from the terminal body.

Smartphones, which constitute the majority of mobile phones, are configured to have various functions. For this, smartphones include, for example, various sensors and cameras. In recent years, various smartphones equipped with a flexible display have also been introduced.

Accordingly, there is a constant need for development of a device (smartphone) that may have various functions, may be small in size so as to be portable, and may implement a large-screen display as needed.

SUMMARY OF THE INVENTION

The present disclosure is directed to providing a flexible display device in which, since a camera may be mounted on a rear surface of the flexible display device and an exposed (visible) area of a flexible display on a front surface of the flexible display device may continuously change, the exposed area of the flexible display on the front surface of the flexible display device can be further increased.

The present disclosure is further directed to providing a flexible display device capable of further increasing an exposed area of a flexible display on a front surface of the flexible display device, without the flexible display interfering with a camera.

The present disclosure is still further directed to providing a flexible display device capable of increasing a range (stroke) of movement of a second body relative to a first body.

The present disclosure is still further directed to providing a flexible display device capable of stably modifying a flexible display, when a camera is mounted on either side on a rear surface of the flexible display device.

A flexible display device according to an embodiment of the present disclosure is made to be carried and held by a user.

The flexible display device may include a body, a flexible display, and a camera.

The body may include a first body, a second body, and a support.

The second body may be configured to move relative to the first body between a first position and a second position. The first position is a relative position of the second body relative to the first body, and the second position is also a relative position of the second body relative to the first body.

When the second body is at the first position relative to the first body, the state of the flexible display device is referred to as a first state. Further, when the second body is at the second position relative to the first body, the state of the flexible display device is referred to as a second state. Accordingly, in the description of the present disclosure, "the first position" may be used in the same sense as "the first state of the flexible display device", and "the second position" may be used in the same sense as "the second state of the flexible display device".

A movement direction of the second body relative to the first body may be parallel to a first direction.

The support is coupled to the second body, and moves together with the second body.

The support may be formed in the shape of a circular roller that has a uniform cross-section in a second direction orthogonal to the first direction.

The support may be configured to rotate in both directions about a central axis parallel to the second direction.

The flexible display may include a first region, a second region, and a third region that are sequentially connected to each other.

At least a portion of the flexible display is formed to be curved, and the flexible display changes in shape by being pushed by the support as the second body moves relative to the first body.

The first region may be parallel to the first and second directions. The first region may be disposed at a front of the first body. The first region may be fixed in front of the first body based on a third direction orthogonal to the first and second directions.

The second region is configured to extend from the first region and to be partially curved around the support.

The second region may include a first connected region and a second connected region.

The first connected region is adjacent to the first region.

The second connected region is between the first connected region and the third region.

The third region is configured to extend from the second region on the opposite side of the first region The third region may be formed in the shape of a film that is flexibly curved.

The camera is disposed at a rear surface of the body.

The camera may be fixed to an outer surface of the first body toward an edge of the flexible display device away from the support.

The camera may be fixed behind the first body based on the third direction, and may be located away from the support. Further, two or more cameras may be arranged in the second direction.

In the flexible display device according to an embodiment of the present disclosure, an area of the second region forming the same plane with the first region is larger when the second body is at the second position than when the second body is at the first position.

When the second body is at the first position, based on the first direction, the distance from the support to an edge of at least a portion of the third region may be greater than the distance from the support to the camera.

When the second body is at the first position, based on the first direction, the distance from the support to an end of at least a portion of the third region may be equal to or greater than the distance from the support to a center of the camera.

When the second body is at the first position, the first connected region is curved around the support, and a plane of the second connected region is parallel to a plane of the first region.

When the second body is at the first position, the third region may be located in the same line as the camera in the second direction when viewed from the third direction.

When the second body is at the second position, the first connected region may form the same plane with the first region, at least a portion of the second connected region may be curved around the support, and at least a portion of the third region may be curved around the support.

When the second body is at the second position, a part of the third region may be curved around the support and a plane of a remaining part thereof may be parallel to a plane of the first region.

When the second body is at the second position, the third region may be located in the same line as the support in the second direction when viewed from the third direction.

An outer surface of the first body and an outer surface of the second body may together form a rear surface of the flexible display device.

The second and third regions may be configured to move between the first body and the second body.

The second body may include a second transparent region and a second non-transparent region.

The second transparent region is made transparent such that the second region is visually exposed to the outside.

The second non-transparent region is made non-transparent such that the third region is not visually exposed to the outside.

The flexible display device may further include a touch panel coupled to the second transparent region. When the second body is at the first position, the second region, the second transparent region, and the touch panel may be arranged to overlap each other, and the second region and the touch panel may be combined to enable a touch input.

When the second body is at the first position, an inner surface of the first body may face an outer surface of the second body.

The flexible display device may further include a wireless transmission/reception part.

When the second body is at the first position, when viewed from the third direction orthogonal to the first and second directions, the wireless transmission/reception part overlaps with the third region, and is fixed to the inner surface of the first body.

The wireless transmission/reception part may include, for example, an antenna, a wireless communication module, and a wireless charging module. Accordingly, the flexible display device according to an embodiment of the present disclosure may perform wireless charging or wireless communication through the wireless transmission/reception part.

The flexible display device may further include a tension generator.

The tension generator may be configured to couple the first body or the second body to the third region and to pull the third region away from the support.

The tension generator may be configured to couple the first body to the third region, and provide a tensioning force to the flexible display when the second body is at the second position.

The third region may include a first end region and a second end region.

When the second body is at the first position, the first end region may be formed in the same line as the camera in the second direction when viewed from the third direction, and may have a uniform width in the second direction.

The second end region may be formed in the same line as the camera in the first direction when viewed from the third direction, may have a uniform width in the second direction, and may be coupled to the first end region.

The second body may be located behind the first body based on the third direction, and the second body may include a first support region and a second support region.

When the second body is at the first position, the first support region may be formed to shield the first end region.

When the second body is at the first position, the second support region may be formed to shield the second end region.

The flexible display device may further include a first rail, a second rail, a first slider, and a second slider.

The first rail may be configured to extend in the first direction, and may be fixed to the first support region away from the second support region.

The second rail may be configured to extend in the first direction, and may be fixed to the second support region away from the first support region.

The first slider may be coupled to perform sliding movement along the first rail, and may be fixed to the first body.

The second slider may be coupled to perform sliding movement along the second rail, and may be fixed to the first body.

In an embodiment of the present disclosure, based on the first direction, the distance from the support to ends of the first and second rails may be greater than the distance from the support to an end of the second support region, respectively.

The flexible display device may further include a first tension generator and a second tension generator.

The first tension generator may be configured to couple the first body to the first end region, and provide a tensioning force to the flexible display when the second body is at the second position.

The second tension generator may be configured to couple the first body to the second end region, and provide a tensioning force to the flexible display when the second body is at the second position.

The tension generator according to an embodiment of the present disclosure may include a tension housing, a spool, a spiral spring, and a wire.

The tension body is coupled to the first body.

The spool is configured to rotate inside the tension body.

The spiral spring is configured to provide an elastic rotational force to the spool. The spiral spring is received within the tension body.

One end of the wire is fixed to and wound around the spool and the other end of the wire is coupled to the third region.

The flexible display device may further include a coupling beam, a stopper, and a trigger.

The coupling beam is configured to mediate the coupling between the third region and the tension generator.

The stopper is configured to fix the coupling beam to the first body.

The trigger is configured to separate the coupling beam and the stopper from the first body.

In the flexible display device according to the embodiments of the present disclosure, the flexible display may include the first region, the second region, and the third region. When the second body is at the first position, based on the first direction, the distance from the support to an end (edge) of the third region may be greater than the distance from the support to the camera, and when the second body is at the second position, the third region may move to the support. Accordingly, since the flexible display device may be configured such that the camera may be mounted on the rear surface thereof and an exposed (visible) area of the flexible display on the front surface thereof may continuously change, the exposed area of the flexible display on the front surface of the flexible display device can be further increased.

In the flexible display device according to the embodiments of the present disclosure, the third region of the flexible display may include the first and second end regions, and the second body may include the first and second support regions. Accordingly, the flexible display device may be configured such that protection and support of the flexible display can be achieved by the second body and the exposed area of the flexible display on the front surface of the flexible display device can be further increased, without the flexible display interfering with the camera.

In addition, since the flexible display device according to the embodiments of the present disclosure may include the first rail, the second rail, the first slider, and the second slider, and based on the first direction, the distance from the support to the ends of the first and second rails may be greater than the distance from the support to the end of the second support region, respectively, the range (stroke) of movement of the second body relative to the first body can be increased.

Since the flexible display device according to the embodiments of the present disclosure may include the first and second tension generators, stable modification of the flexible display can be achieved, even when the camera is mounted on either side of the rear surface of the flexible display device.

DETAILED DESCRIPTION

Figure 1:
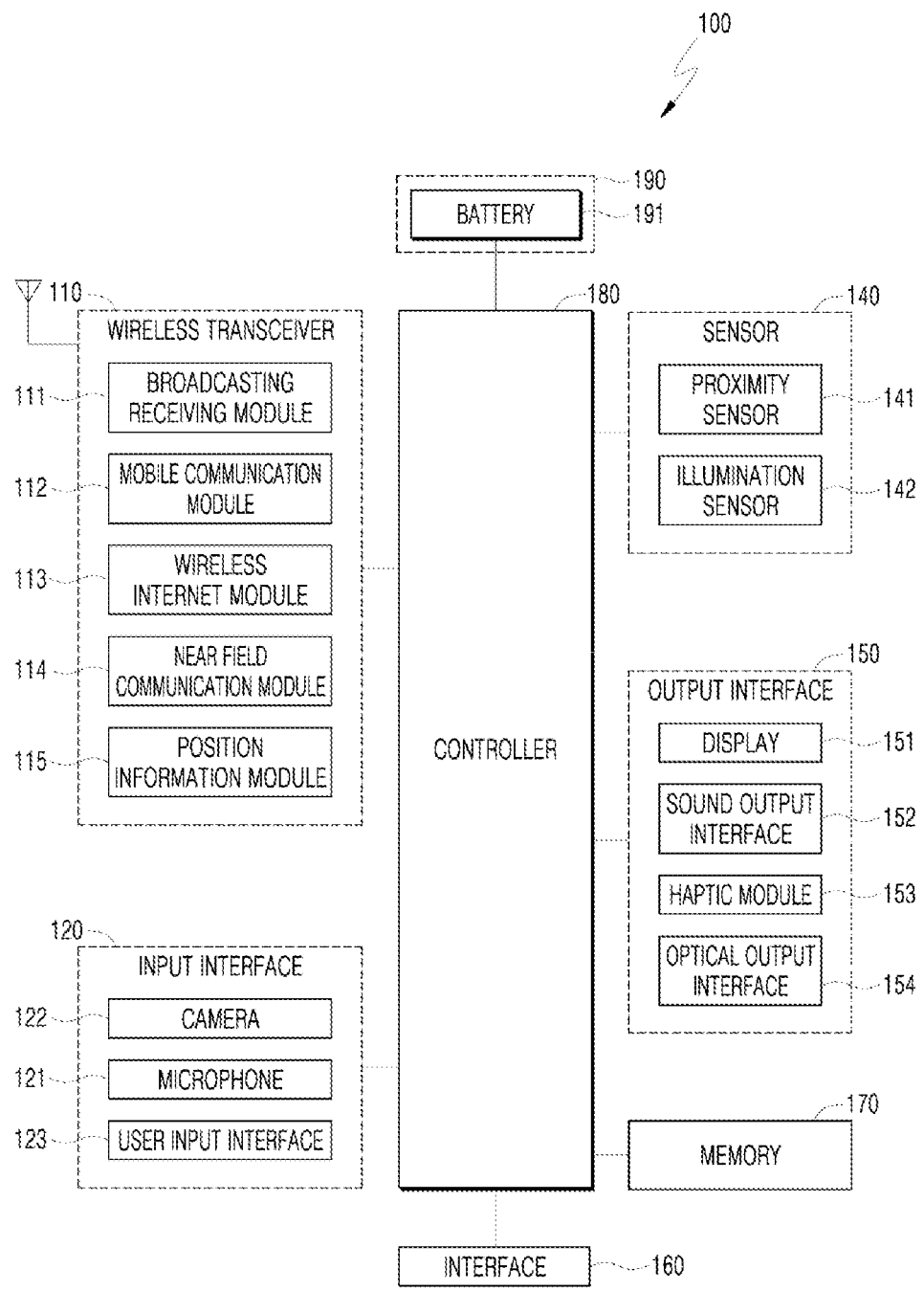
FIG. 1 is a block diagram for explaining a mobile terminal.

Hereinafter, exemplary embodiments disclosed herein will be described in detail with reference to the accompanying drawings, and like reference numerals designate like elements, and redundant description thereof will be omitted. Suffixes "module" and "unit or portion" for elements used in the following description are merely provided for facilitation of preparing this specification, and thus they are not granted a specific meaning or function. Wherever possible, the same reference numbers will be used throughout the drawings to refer to the same or like parts. In the following description, known functions or structures, which may confuse the substance of the present disclosure, are not explained. The accompanying drawings are used to help easily explain various technical features and it should be understood that the embodiments presented herein are not limited by the accompanying drawings. As such, the present disclosure should be construed to extend to any alterations, equivalents and substitutes in addition to those which are particularly set out in the accompanying drawings.

Although the terms first, second, and the like, may be used herein to describe various elements, these elements should not be limited by these terms. These terms are generally only used to distinguish one element from another.

When an element or layer is referred to as being "on," "engaged to," "connected to," or "coupled to" another element or layer, it may be directly on, engaged, connected, or coupled to the other element or layer, or intervening elements or layers may be present. In contrast, when an element is referred to as being "directly on," "directly engaged to," "directly connected to," or "directly coupled to" another element or layer, there may be no intervening elements or layers present.

The singular expressions include plural expressions unless the context clearly dictates otherwise.

It should be understood that the terms "comprises," "comprising," "includes," "including," "containing," "has," "having" or any other variation thereof specify the presence of stated features, integers, steps, operations, elements, and/or components, but do not preclude the presence or addition of one or more other features, integers, steps, operations, elements, and/or components.

A flexible display device (hereinafter, referred to as a 'display device') described in the present specification may include a mobile terminal such as a portable phone, a smartphone, a laptop computer, a digital broadcasting terminal, a personal digital assistant (PDA), a portable multimedia player (PMP), a navigation, a slate PC, a tablet PC, an ultra-book, a wearable device, a smart watch, a smart glass, a head mounted display (HMD), and the like.

It will be apparent to those skilled in the art that the configuration according to the embodiment disclosed in the present specification may be applied to a fixed terminal such as a digital TV, a desktop computer, a digital signage except for an example that is applied only to a mobile terminal. Hereinafter, in the present disclosure, for the convenience of description, the mobile terminal will be first described as an example of the display device.

FIG. 1 is a block diagram for explaining a mobile terminal 100 according to the present disclosure.

The mobile terminal 100 may include, for example, a wireless transceiver 110, an input interface 120, a sensor 140, an output interface 150, an interface 160, a memory 170, a controller 180, and a power supply 190. The components shown in FIG. 1 are not essential to implement the mobile terminal, and the mobile terminal described in the present disclosure may include more or fewer components than the components described above.

More specifically, the wireless transceiver 110 may include one or more modules that enable wireless communication between the mobile terminal 100 and a wireless communication system, between the mobile terminal 100 and another mobile terminal 100, or between the mobile terminal 100 and an external server. Further, the wireless transceiver 110 may include one or more modules that connect the mobile terminal 100 to one or more networks.

The wireless transceiver 110 may include at least one of a broadcast receiving module 111, a mobile communication module 112, a wireless internet module 113, a near field communication module 114, or a position information module 115.

The input interface 120 may include a camera 122 or an image input interface that inputs an image signal, a microphone 121 or an audio input interface that inputs an audio signal, and a user input interface 123 (for example, a touch key or a mechanical key) that receives information from a user. Voice data or image data collected by the input interface 120 may be analyzed and processed as a control command of the user.

The sensor 140 may include one or more sensors that sense at least one of information in the mobile terminal, surrounding environment information around the mobile terminal, or user information. For example, the sensor 140 may include at least one of a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, an ultrasonic sensor, an optical sensor (for example, a camera 122), a microphone 121, a battery gauge, an environment sensor (for example, a barometer, a hygrometer, a thermometer, a radiation sensor, a thermal sensor, a gas sensor, etc.), or a chemical sensor (for example, an electronic nose, a healthcare sensor, and a biometric sensor). Further, the mobile terminal disclosed in the present specification may combine and utilize information sensed by at least two sensors from the above-mentioned sensors.

The output interface 150 generates outputs related to visual, auditory, or tactile senses, and may include at least one of a display 151, a sound output interface 152, a haptic module 153, or an optical output interface 154. The display 151 forms a mutual layered structure with a touch sensor, or is formed integrally to be implemented as a touch screen. The touch screen simultaneously may serve as a user input interface 123 that provides an input interface between the mobile terminal 100 and the user while providing an output interface between the mobile terminal 100 and the user.

The interface 160 serves as a passage between the mobile terminal 100 and various types of external devices that are connected to the mobile terminal 100. The interface 160 may include at least one of a wired/wireless headset port, an external charger port, a wired/wireless data port, a memory card port, a port for connecting a device equipped with an identification module, an audio input/output (I/O) port, a video input/output (I/O) port, or an earphone port. As the external device is connected to the interface 160, the mobile terminal 100 may perform appropriate control on the connected external device.

Further, the memory 170 may store data that supports various functions of the mobile terminal 100. The memory 170 may store a plurality of application programs (or applications) driven in the mobile terminal, and data and commands for operations of the mobile terminal 100. At least some of the application programs may be downloaded from an external server through wireless communication. Further, at least some of the application programs for the basic functions of the mobile terminal 100 (for example, functions for receiving and making calls and receiving and sending messages) may be provided in the mobile terminal 100 from the time of manufacture. The application programs may be stored in the memory 170, and may be installed on the mobile terminal 100 so as to be driven by the controller 180 to perform operations (or functions) of the mobile terminal.

In addition to the operations related to the application programs, the controller 180 may generally control overall operation of the mobile terminal 100. The controller 180 may process a signal, data, or information that is inputted or outputted through the above-described components or drive the application programs stored in the memory 170 to provide or process appropriate information or functions to the user.

Further, in order to drive the application programs stored in the memory 170, the controller 180 may control at least some of components described with reference to FIG. 1. Moreover, the controller 180 may combine and operate at least two of components included in the mobile terminal 100 to drive the application programs.

Under the control of the controller 180, the power supply 190 may be supplied with external power or internal power, and supply power to each component included in the mobile terminal 100. The power supply 190 includes a battery, which may be a built-in battery or a replaceable battery.

At least some of the above-described components may operate in cooperation with each other to implement the operation, the control, or the control method of the mobile terminal according to various embodiments which will be described below. Further, the operation, the control, or the control method of the mobile terminal may be implemented on the mobile terminal by driving at least one application program stored in the memory 170.

Hereinafter, prior to describing various embodiments implemented by the mobile terminal 100 described above, the above-mentioned components will be described in more detail with reference to FIG. 1.

First, the wireless transceiver 110 will be described. The broadcast receiving module 111 of the wireless transceiver 110 receives a broadcast signal and/or broadcast-related information from an external broadcast management server through a broadcast channel. The broadcast channel may include a satellite channel and a ground wave channel. Two or more broadcast receiving modules for simultaneous broadcast reception or broadcast channel switching for at least two broadcast channels may be provided to the mobile terminal 100.

The broadcast management sever may refer to a server that generates and transmits a broadcast signal and/or broadcast-related information or a server that is supplied with the previously generated broadcast signal and/or broadcast-related information to transmit the broadcast signal and/or the broadcast-related information to the terminal. The broadcast signal may include not only a TV broadcast signal, a radio broadcast signal, and a data broadcast signal, but also a broadcast signal obtained by combining the TV broadcast signal or the radio broadcast signal with the data broadcast signal.

The broadcast signal may be encoded according to at least one of technical standards (or broadcast schemes, for example, ISO, IEC, DVB, or ATSC) for transmitting and receiving a digital broadcast signal, and the broadcast receiving module 111 may receive the digital broadcast signal using an appropriate method for the technical specification defined by the technical standards.

The broadcast-related information may refer to information related to a broadcast channel, a broadcast program, or a broadcast service provider. The broadcast-related information may also be provided over the mobile communication network. In this case, the broadcast-related information may be received by the mobile communication module 112.

The broadcast-related information may exist in various types, such as an electronic program guide (EPG) of a digital multimedia broadcast (DMB) or an electronic service guide (ESG) of a digital video broadcast-handheld (DVB-H). The broadcast signal and/or the broadcast-related information received by the broadcast receiving module 111 may be stored in the memory 170.

The mobile communication module 112 may transmit/receive a wireless signal to/from at least one of a base station, an external terminal, or a server over a mobile communication network established according to the technical standards or communication methods for mobile communication (for example, Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), and Long Term Evolution-Advanced (LTE-A).)

The wireless signal may include a voice call signal, a video call signal, or various types of data in accordance with transmission or reception of a text/multimedia message.

The wireless internet module 113 refers to a module for wireless internet connection, and may be embodied in the mobile terminal 100 or installed at the outside of the mobile terminal 100. The wireless internet module 113 may be configured to transmit/receive a wireless signal over a communication network according to wireless internet technologies.

The wireless internet technologies include, for example, wireless LAN (WLAN), wireless fidelity (Wi-Fi), Wi-Fi direct, digital living network alliance (DLNA), wireless broadband (WiBro), world interoperability for microwave access (WiMAX), high speed downlink packet access (HSDPA), high speed uplink packet access (HSUPA), long term evolution (LTE), and long term evolution-advanced (LTE-A). The wireless internet module 113 may transmit or receive data in accordance with at least one wireless internet technology within a range including internet technology that have not been described above.

From the viewpoint that the wireless internet connection through, for example, WiBro, HSDPA, HSUPA, GSM, CDMA, WCDMA, LTE, and LTE-A is performed over the mobile communication network, the wireless internet module 113 that performs the wireless internet connection over the mobile communication network may be understood as a type of the mobile communication module 112.

The near field communication module 114 is for short range communication, and may support the short range communication using at least one of Bluetooth™, radio frequency identification (RFID), infrared data association (IrDA), ultra-wideband (UWB), ZigBee, Near Field Communication (NFC), wireless fidelity (Wi-Fi), Wi-Fi Direct, or Wireless Universal Serial Bus (Wireless USB). The near field communication module 114 may support wireless communication between the mobile terminal 100 and the wireless communication system, between the mobile terminal 100 and the other mobile terminal 100, or between the mobile terminal 100 and a network in which the other mobile terminal 100 (or external server) is located, over the wireless local area network. The wireless local area network may be a wireless personal area network.

Here, the other mobile terminal 100 may be a wearable device (for example, a smart watch, a smart glass, or a head mounted display (HMD)) that is capable of exchanging data (or interworking) with the mobile terminal 100 according to the present disclosure. The near field communication module 114 may detect (or recognize) the wearable device that is capable of communicating with the mobile terminal 100, in the vicinity of the mobile terminal 100. Moreover, when the detected wearable device is authenticated to communicate with the mobile terminal 100 according to the present disclosure, the controller 180 may transmit at least a portion of data processed in the mobile terminal 100 to the wearable device through the near field communication module 114. Therefore, the user of the wearable device may use the data processed in the mobile terminal 100, through the wearable device. For example, according to this, when a phone call is received by the mobile terminal 100, the user may make a phone call through the wearable device, or when a message is received by the mobile terminal 100, the user may check the received message through the wearable device.

The position information module 115 is a module for obtaining a position (or a current position) of a mobile terminal, and its representative examples include a global positioning system (GPS) module or a wireless fidelity (Wi-Fi) module. For example, when the GPS module is utilized, the mobile terminal may obtain the position of the mobile terminal using a signal transmitted from the GPS satellite. As another example, when the Wi-Fi module is utilized, the mobile terminal may obtain the position of the mobile terminal based on information on a wireless access point (AP) that transmits and receives wireless signals with the Wi-Fi module. If necessary, the position information module 115 may alternatively or additionally perform a function of another module of the wireless transceiver 110 to obtain data on the position of the mobile terminal. The position information module 115 is a module used to obtain the position (or the current position) of the mobile terminal, and is not limited to a module that directly calculates or obtains the position of the mobile terminal.

Next, the input interface 120 is for inputting video information (or signal), audio information (or signal), data, or information inputted by the user, and the mobile terminal 100 may include one or a plurality of cameras 122 to input the video information. The camera 122 processes an image frame such as a still or moving image obtained by an image sensor in a video call mode or a photographing mode. The processed image frame may be displayed on the display 151, or may be stored in the memory 170. Further, the plurality of cameras 122 included in the mobile terminal 100 may be arranged to form a matrix structure, and a plurality of pieces of image information having various angles or focal points may be inputted to the mobile terminal 100 through the cameras 122 that form the matrix structure. Further, the plurality of cameras 122 may be arranged to form a stereo structure to obtain left and right images used to implement a stereoscopic image.

The microphone 121 processes an external sound signal as electrical voice data. The processed voice data may be utilized in various manners in accordance with the function (or an application program that is being executed) that is being performed by the mobile terminal 100. Various noise removal algorithms for removing noise generated during the process of receiving the external sound signal may be implemented in the microphone 121.

The user input interface 123 is for receiving information from the user, and when the information is inputted through the user input interface 123, the controller 180 may control the operation of the mobile terminal 100 so as to correspond to the inputted information. The user input interface 123 may include a mechanical input interface (or a mechanical key, for example, a button, a dome switch, a jog wheel, and a jog switch that are located on a front, rear, or side surface of the mobile terminal 100) and a touch type input interface.

For example, the touch type input interface may be formed as a virtual key, a soft key, or a visual key that is displayed on the touch screen through a software process, or a touch key that is disposed on a part other than the touch screen. The virtual key or visual key may be displayed on the touch screen in various shapes, and, for example, may be formed as graphics, text, icons, video, or a combination thereof.

The sensor 140 senses at least one of information in the mobile terminal, surrounding environment information around the mobile terminal, or user information, and generates a sensing signal corresponding to the information. The controller 180 may control the driving or the operation of the mobile terminal 100 or perform data processing, functions, or operations related to the application program installed in the mobile terminal 100, based on the sensing signal. Representative sensors among various sensors that may be included in the sensor 140 will be described in more detail below.

First, the proximity sensor 141 refers to a sensor that senses the presence of an object approaching a predetermined sensing surface or nearby objects, using an electromagnetic field force or infrared ray without any mechanical contact. The proximity sensor 141 may be disposed in an internal area of the mobile terminal that is enclosed by the above-described touch screen or in the vicinity of the touch screen.

Examples of the proximity sensor 141 may include, for example, a transmission type photoelectric sensor, a direct reflection type photoelectric sensor, a mirror reflection type photoelectric sensor, a high frequency oscillation type proximity sensor, a capacitive proximity sensor, a magnetic proximity sensor, and an infrared proximity sensor. When the touch screen is a capacitive type, the proximity sensor 141 may be configured to detect the proximity of an object with a change in the electric field in accordance with the proximity of the object having conductivity. In this case, the touch screen (or the touch sensor) itself may be classified as a proximity sensor.

For convenience of description, when the object approaches the touch screen without contacting the touch screen, and it is recognized that the object is located over the touch screen, it is referred to as a "proximity touch". When the object actually touches the touch screen, it is referred to as a "contact touch". A position at which the object proximately touches the touch screen refers to a position at which the object vertically corresponds to the touch screen when the object proximately touches the touch screen. The proximity sensor 141 may sense the proximity touch and a proximity touch pattern (for example, a proximate touch distance, a proximate touch direction, a proximate touch speed, a proximate touch time, a proximate touch position, and a proximate touch movement state). As described above, the controller 180 may process data (or information) corresponding to the proximate touch operation and the proximate touch pattern sensed by the proximity sensor 141, and may further display visual information corresponding to the processed data on the touch screen. Furthermore, the controller 180 may control the mobile terminal 100 to process different operations or data (or information) depending on whether the touch on the same point on the touch screen is the proximity touch or the contact touch.

The touch sensor senses a touch (or a touch input) applied to the touch screen (or the display 151) using at least one of various touch types such as a resistive film type, a capacitive type, an infrared type, an ultrasonic type, and a magnetic field type.

For example, the touch sensor may be configured to convert a change in a pressure applied to a specific portion of the touch screen, or a capacitance generated in a specific portion, into an electrical input signal. The touch sensor may be configured to detect a position and area where a touch subject that applies a touch onto the touch screen is touched on the touch sensor, and a pressure and capacitance at the time of the touch. Here, the touch subject is an object that applies a touch to the touch sensor, and may include, for example, a finger, a touch pen, a stylus pen, and a pointer.

As described above, when there is the touch input to the touch sensor, corresponding signal(s) is transmitted to a touch controller. The touch controller processes the signal(s) and then transmits corresponding data to the controller 180. By doing this, the controller 180 may confirm which area of the display 151 is touched. Here, the touch controller may be a separate component from the controller 180, or may be the controller 180 itself.

The controller 180 may perform different control or the same control depending on a type of a touch subject that touches the touch screen (or a touch key provided other than the touch screen). Whether to perform the different or the same control depending on the type of touch subject may be determined in accordance with an operating state of the current mobile terminal 100 or an application program that is being executed.

The touch sensor and the proximity sensor that are described above may, independently or in combination, sense various types of touches on the touch screen, such as a short (or tap) touch, a long touch, a multi touch, a drag touch, a flick touch, a pinch-in touch, a pinch-out touch, a swipe touch, or a hovering touch.

The ultrasonic sensor may recognize position information on a sensing object using an ultrasonic wave. The controller 180 may calculate a position of a wave generating source by using information sensed by the optical sensor and the plurality of ultrasonic sensors. The position of the wave generating source may be calculated using the property that light is much faster than the ultrasonic wave, that is, the time in which light reaches the optical sensor is much faster than the time in which the ultrasonic wave reaches the ultrasonic sensor. More specifically, the position of the wave generating source may be calculated using a time difference of the time of arrival of the ultrasonic wave with respect to light that serves as a reference signal.

As seen from the configuration of the input interface 120, the camera 122 includes at least one of a camera sensor (for example, a CCD and a CMOS), a photo sensor (or an image sensor), or a laser sensor.

The camera 122 and the laser sensor may be combined to sense a touch of a sensing object for a three-dimensional stereoscopic image. The photo sensor, which may be stacked on a display element, is configured to scan a motion of the sensing object proximate to the touch screen. More specifically, the photo sensor includes photo diodes and transistors (TR) in rows/columns so as to scan contents disposed on the photo sensor by using an electrical signal that changes in accordance with an amount of light applied to the photo diode. That is, the photo sensor calculates coordinates of the sensing object in accordance with a changed amount of light, and position information on the sensing object may be obtained through the coordinates.

The display 151 displays (outputs) information processed in the mobile terminal 100. For example, the display 151 may display execution screen information on an application program driven in the mobile terminal 100 and user interface (UI), or graphic user interface (GUI) information in accordance with the execution screen information.

Further, the display 151 may be configured as a stereoscopic display that displays a stereoscopic image.

A three-dimensional display type such as a stereoscopic type (a glass type), an autostereoscopic type (a glass-free type), and a projection type (a holographic type) may be applied to the stereoscopic display.

The sound output interface 152 may output audio data received from the wireless transceiver 110 or stored in the memory 170 in, for example, a call signal reception mode, a phone-call mode, a recording mode, a voice recognition mode, and a broadcasting reception mode. The sound output interface 152 may also output a sound signal (for example, a call signal reception sound and a message reception sound) related to a function performed in the mobile terminal 100. Such a sound output interface 152 may include, for example, a receiver, a speaker, and a buzzer.

The haptic module 153 may generate various tactile effects that the user may feel. A representative example of the tactile effect generated by the haptic module 153 may be vibration. For example, an intensity and pattern of the vibration generated in the haptic module 153 may be controlled by the selection of the user or a setting of the controller 180. For example, the haptic module 153 may compose different vibrations to output the composed vibrations, or sequentially output the different vibrations.

In addition to the vibration, the haptic module 153 may generate various tactile effects, such as effects by, for example, a pin arrangement that vertically moves to a contact skin surface, an injection force or a suction force of air through an injection port or a suction port, grazing on a skin surface, electrode contact, and stimulation of an electrostatic force or effects of reproducing a cold or hot sensation using a heat absorbing or heat emitting element.

The haptic module 153 may not only transmit a tactile effect by means of direct contact, but may also be implemented to allow the user to feel a tactile effect by muscular sensation of a finger or an arm. Two or more haptic modules 153 may be provided in accordance with a configuration aspect of the mobile terminal 100.

The optical output interface 154 outputs a signal for notifying occurrence of an event by using light from a light source of the mobile terminal 100. Examples of events generated in the mobile terminal 100 may include message reception, call signal reception, missed call, alarm, schedule notification, email reception, and information reception through an application.

The signal outputted from the optical output interface 154 is implemented as the mobile terminal emits single color or a plurality of color light on a front surface or a rear surface. When the mobile terminal senses the event confirmation of the user, the signal output may be completed.

The interface 160 serves as a passage with all external devices that are connected to the mobile terminal 100. The interface 160 receives data from the external device or is supplied with power from the external device to supply power to each component in the mobile terminal 100, or transmits data in the mobile terminal 100 to the external device. For example, the interface 160 may include, for example, a wired/wireless headset port, an external charger port, a wired/wireless data port, a memory card port, a port that connects a device equipped with an identification module, an audio input/output (I/O) port, a video input/output (I/O) port, and an earphone port.

The identification module is a chip in which various pieces of information for authenticating a usage right of the mobile terminal 100 is stored, and may include, for example, a user identity module (UIM), a subscriber identity module (SIM), and a universal subscriber identity module (USUM). A device (hereinafter, referred to as "identification device") equipped with the identification module may be manufactured as a smart card. Therefore, the identification device may be connected to the terminal 100 through the interface 160.

When the mobile terminal 100 is connected to an external cradle, the interface 160 may serve as a passage through which power is supplied from the cradle to the mobile terminal 100 or a passage through which various command signals inputted to the cradle by a user are transmitted to the mobile terminal 100. Various command signals or power inputted from the cradle may operate a signal for recognizing that the mobile terminal 100 is precisely mounted in the cradle.

The memory 170 may store a program for an operation of the controller 180, or temporarily store inputted/outputted data (for example, a phone book, a message, a still image, and a moving image). The memory 170 may store data related to vibrations or sounds of various patterns outputted when the touch is inputted onto the touch screen.

The memory 170 may include at least one type of storage medium of a flash memory type, a hard disk type, a solid state disk (SSD) type, a silicon disk drive (SDD) type, a multimedia card micro type, and card type memories (for example, SD or XD memory), a random access memory (RAM), a static random access memory (SRAM), a read-only memory (ROM), an electrically erasable programmable read-only memory (EEPROM), a programmable read only memory (PROM), a magnetic memory, a magnetic disk, or an optical disk. The mobile terminal 100 may operate in association with a web storage that performs a storage function of the memory 170 on the Internet.

As described above, the controller 180 may control an operation related to the application program and an overall operation of the mobile terminal 100. For example, when the state of the mobile terminal satisfies a predetermined condition, the controller 180 may execute or release a locking state that restricts an input of a control command of a user regarding the applications.

Further, the controller 180 may perform control and processing related to, for example, voice call, data communication, and video call, or may perform a pattern recognition process that may recognize a handwriting input or a picture drawing input performed on the touch screen as a text or an image, respectively. Moreover, the controller 180 may control any one or a combination of a plurality of components described above to implement various embodiments which will be described below, in the mobile terminal 100 according to the present disclosure.

Under the control of the controller 180, the power supply 190 is supplied with an external power or an internal power, and supplies power required for operating the components. The power supply 190 includes a battery, and the battery may be a chargeable embedded battery and be detachably coupled to a terminal body to be charged.

Further, the power supply 190 may include a connection port, and the connection port may be configured as one example of an interface 160 to which an external charger which supplies power to charge a battery is electrically connected.

As another example, the power supply 190 may be configured to wirelessly charge the battery without using the connection port. In this case, the power supply 190 may receive power from an external wireless power transmission device by using one or more of an inductive coupling scheme based on a self-induction phenomenon or a magnetic resonance coupling scheme based on an electromagnetic resonance phenomenon.

Various embodiments below may be implemented in a recording medium readable by a computer or a similar device using hardware, software, or a combination thereof, for example.

The display 151 displays (outputs) information processed in the mobile terminal 100. For example, the display 151 may display execution screen information on an application program driven in the mobile terminal 100 or user interface (UI) and graphic user interface (GUI) information in accordance with the execution screen information The display 151 may include at least one of a liquid crystal display (LCD), a thin film transistor liquid crystal display (TFT LCD), an organic light emitting diode (OLED), a flexible display, a three-dimensional display (3D display), or an electronic ink display (e-ink display).

Further, two or more displays 151 may be provided in accordance with an implementation type of the mobile terminal 100. In this case, a plurality of displays may be disposed to be spaced apart from each other or integrally disposed on one surface of the mobile terminal 100 or may be disposed on different surfaces.

The display 151 may include a touch sensor that senses a touch on the display 151 so as to receive the control command by the touch method. Therefore, when the touch is made on the display 151, the touch sensor senses the touch, and based on the touch, the controller 180 may generate a control command corresponding to the touch. Contents inputted by the touch method may be, for example, letters or numbers, or instructions or designated menu items in various modes.

The microphone 121 is configured to receive a voice of the user, or other sounds. The microphone 121 may be provided in a plurality of locations to receive stereo sounds.

The interface 160 serves as a passage through which the mobile terminal 100 is connected to the external device. For example, the interface 160 may be at least one of a connection terminal for connection with other devices (for example, an earphone or an external speaker), a port for near field communication (for example, an infrared port (IrDA port), a Bluetooth port, and a wireless LAN port) or a power supply terminal for supplying power to the mobile terminal 100. The interface 160 may be implemented as a socket type which accommodates an external card, such as a subscriber identity module (SIM), a user identity module (UIM), and a memory card for information storage.

At least one antenna for wireless communication may be provided in a terminal body. The antenna may be embedded in the terminal body or formed in a case. For example, the antenna which forms a part of the broadcast receiving module 111 (see FIG. 1) may be configured to be withdrawn from the terminal body. Alternatively, the antenna may be formed to be a film type to be attached onto an inner surface of a housing, or a case including a conductive material may serve as an antenna.

The terminal body includes the power supply 190 (see FIG. 1) which supplies power to the mobile terminal 100. The power supply 190 may be embedded in the terminal body, or may include a battery 191 which is configured to be detachable at the outside of the terminal body.

The battery 191 may be configured to be supplied with power through a power cable connected to the interface 160. Further, the battery 191 may be configured to be wirelessly chargeable by a wireless charging device. The wireless charging may be implemented by a self-induction scheme or a resonance scheme (magnetic resonance scheme).

An accessory which protects an outer appearance of the mobile terminal 100 or supports or extends the function thereof may be added to the mobile terminal 100. An example of the accessory may include a cover or a pouch which covers at least one surface of the mobile terminal 100 or accommodates the mobile terminal 100. The cover or the pouch may interwork with the display 151 to extend the function of the mobile terminal 100. Another example of the accessory may include a touch pen which supports or extends a touch input on the touch screen.

Figure 2A:
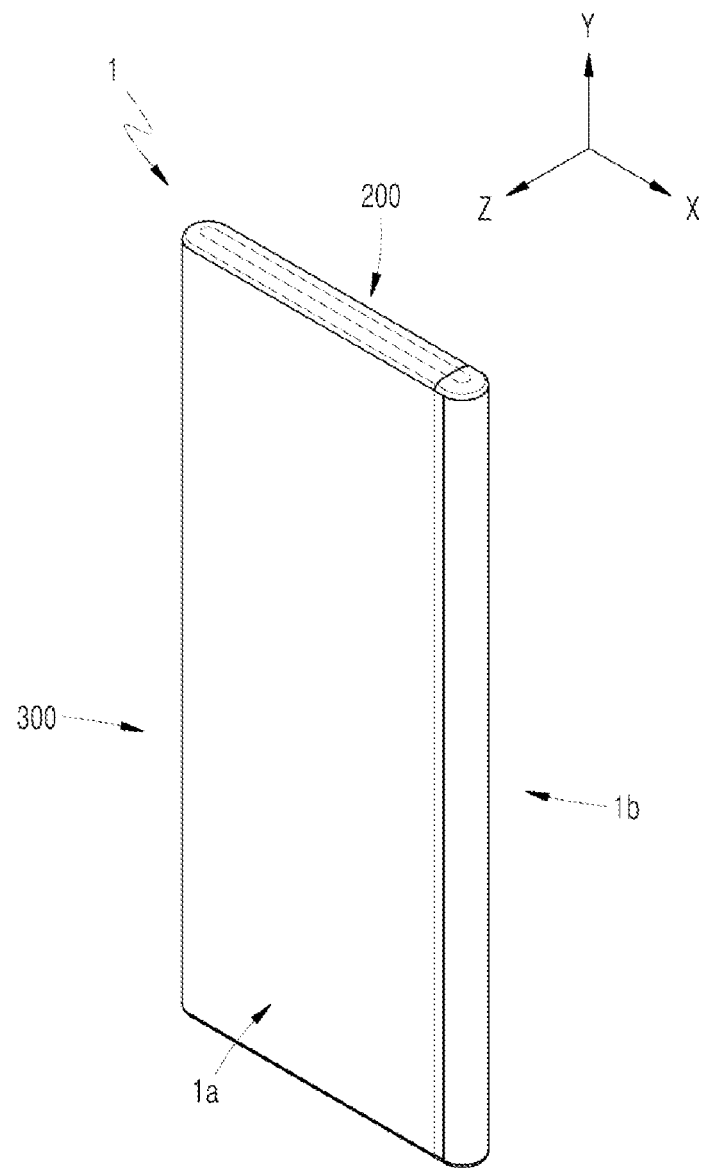
FIG. 2A is a perspective view illustrating a first state of a flexible display device.
Figure 2B:
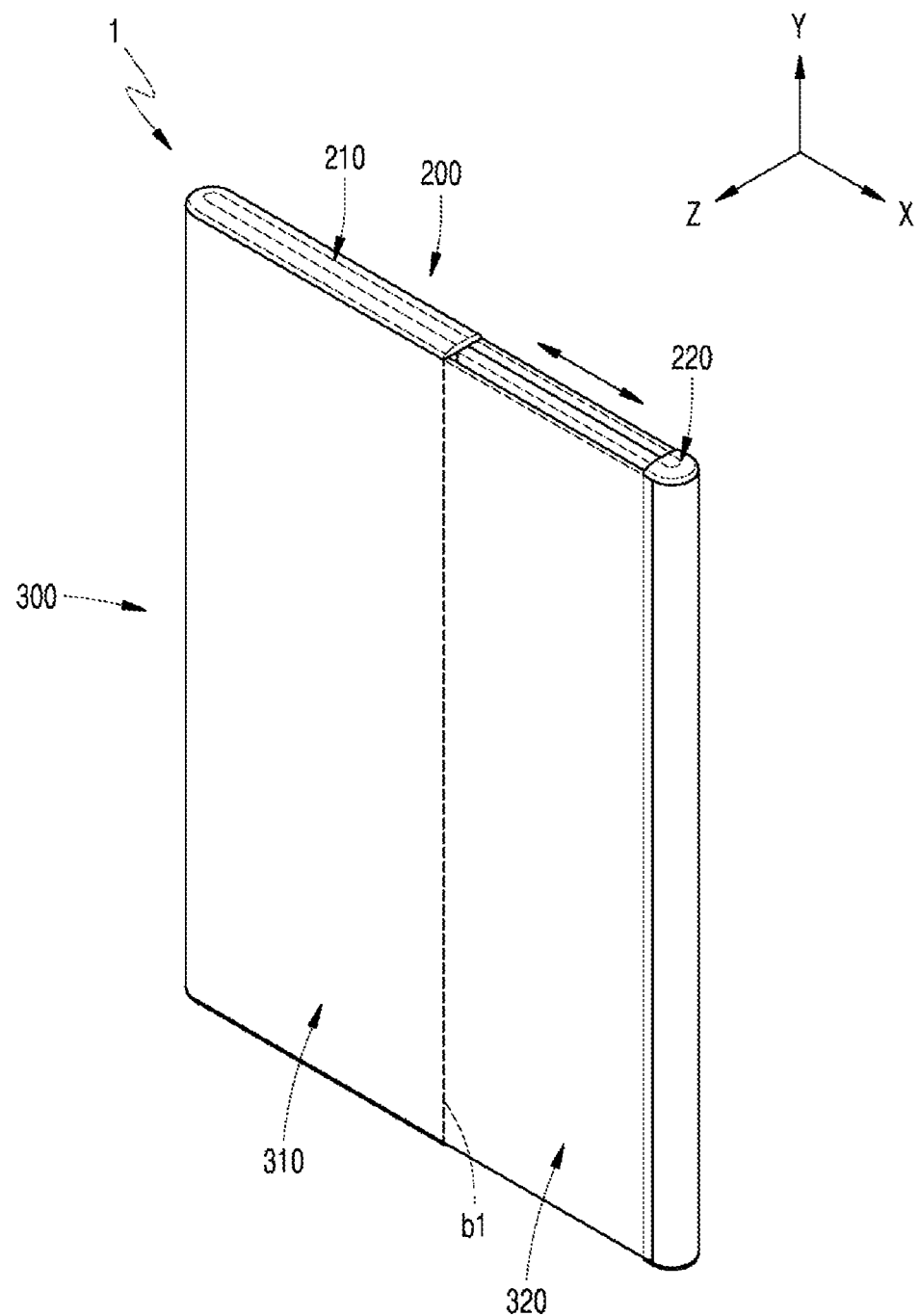
FIG. 2B is a perspective view illustrating a second state in which the flexible display device illustrated in FIG. 2A is modified.

FIG. 2A is a perspective view illustrating a first state of a flexible display device 1, and FIG. 2B is a perspective view illustrating a second state in which the flexible display device illustrated in FIG. 2A is modified.

Figure 3A:
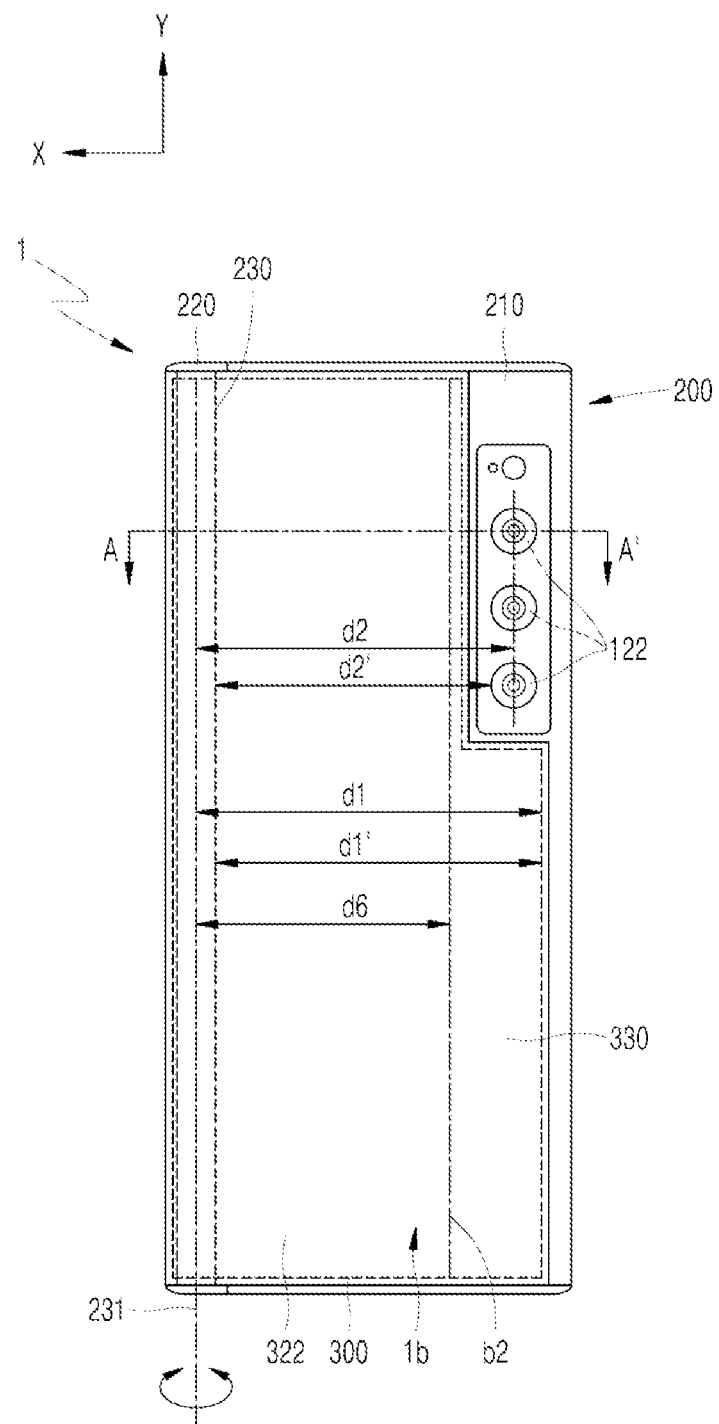
FIG. 3A is a rear view illustrating a first state of the flexible display device.
Figure 3B:
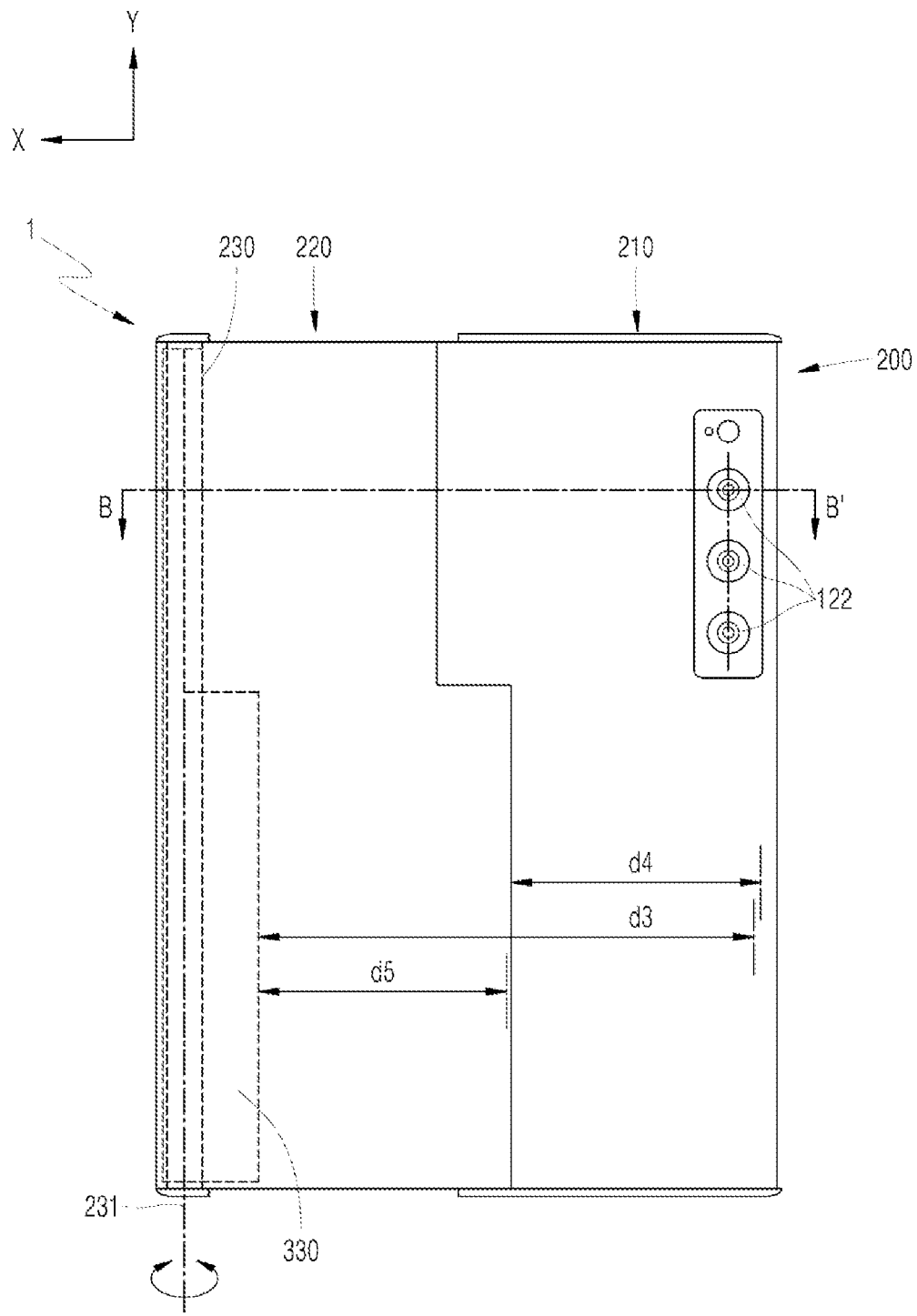
FIG. 3B is a rear view illustrating a second state in which the flexible display device illustrated in FIG. 3A is modified.

FIG. 3A is a rear view illustrating the first state of the flexible display device 1, and FIG. 3B is a rear view illustrating the second state in which the flexible display device 1 illustrated in FIG. 3A is modified. In FIGS. 3A and 3B, a support 230 and a flexible display 300 are represented by dotted lines.

The flexible display device 1 may include a body 200, a flexible display 300, and at least one camera 122. The body 200 may include a first body 210, a second body 220, and a support 230.

In describing embodiments of the present disclosure, a first direction (X direction), a second direction (Y direction), and a third direction (Z direction) shown in the drawings are directions perpendicular to each other.

The flexible display device 1 may include two surfaces 1a and 1b which are opposite to each other. The flexible display device 1 may include a first surface 1a and a second surface 1b. The facing direction of the first surface 1a (direction perpendicular to or substantially perpendicular to the first surface 1a) is opposite to the facing direction of the second surface 1b (direction perpendicular to or substantially perpendicular to the second surface 1b). The flexible display device 1 may be disposed such that the first surface 1a faces the third direction (Z direction) while the second surface 1b faces the direction opposite to the third direction (Z direction). When the first surface 1a corresponds to a front surface of the flexible display device 1, the second surface 1b may correspond to a rear surface of the flexible display device 1.

Hereinafter, unless otherwise specified, a front direction of the flexible display device 1 is referred to as the third direction (Z direction), and a rear direction of the flexible display device 1 refers to the direction opposite to the third direction (Z direction).

The body 200 may form the overall shape of the flexible display device 1. The body 200 may form a frame of the flexible display device 1. The body 200 may be made of a relatively hard material, for example, plastic, carbon, metal, or a combination thereof. Other components constituting the flexible display device 1 may be coupled to the body 200.

The body 200 may be formed in various shapes to support other components coupled thereto.

The body 200 may be flat overall, or may be curved like a curved surface. The interior of the body 200 may be completely filled, or a part thereof may not be filled.

For example, when viewed from the front (Z direction), the body 200 may be formed in a quadrangular shape overall, and may flat overall.

The body 200 may be divided into two or more parts. The body 200 may include a first body 210 and a second body 220, and the first body 210 and the second body 220 may move relative to each other (see FIGS. 2A, 2B, 3A, and 3B).

The second body 220 may perform sliding movement and reciprocating movement relative to the first body 210. Accordingly, when viewed from the front (Z direction), the total area occupied by the body 200 may change.

The second body 220 may perform reciprocating movement relative to the first body 210 between a first position and a second position.

When viewed from the front (Z direction), when the second body 220 is at the first position, the total area occupied by the body 200 (the area of the body 200 projected in the Z direction) may be the smallest (see, for example, FIGS. 2A and 3A), and when the second body 220 is at the second position, the total area occupied by the body 200 (the area of the body 200 projected in the Z direction) may be the largest (see, for example, FIGS. 2B and 3B).

When viewed from the front (Z direction), when the second body 220 is at the first position, the overlapping area of the first body 210 and the second body 220 may be the largest (see, for example, FIGS. 2A and 3A), and when the second body 220 is at the second position, the overlapping area between the first body 210 and the second body 220 may be the smallest (see, for example, FIGS. 2B and 3B).

A movement direction of the second body relative to the first body may be parallel to the first direction (X direction).

The first body 210 may have a predetermined length in the first direction (X direction), and may also have a predetermined length in the second direction (Y direction) orthogonal to the first direction. The first body 210 may have a predetermined length in the third direction (Z direction) orthogonal to the first and second directions, but the length of first body 210 in the third direction may be sufficiently smaller than the length thereof in the first and second directions. Accordingly, the first body 210 may be flat or substantially flat in the first and second directions.

The first body 210 may be formed in the shape of a plate.

The second body 220 may have a predetermined length in the first and second directions. The second body 220 may have a predetermined length in the third direction, but the length of the second body 220 in the third direction may be sufficiently smaller than the length thereof in the first and second directions. Accordingly, the second body 220 may be flat or substantially flat in the first and second directions.

The second body 220 may be formed in the shape of a plate.

The first body 210 and the second body 220 may be formed in the shape of plates that are parallel to each other.

The support may be coupled to, formed on, or fixed to the second body 220. The support, together with the second body 220, may move relative to the first body 210.

The support may be provided inside the flexible display device 1.

The support may cause the flexible display 300 to be curved to change direction. That is, the flexible display 300 formed in the first direction may be curved to form a curved surface on the support 230, and may extend in the direction opposite to the first direction while passing the support 230.

The support 230 may form a U- or C-shaped path through which the flexible display 300 moves, or may support an inner surface of the flexible display 300.

When supporting the inner surface of the flexible display 300, the support 230 may extend in the second direction (Y direction).

At least a portion of the support 230 may have a uniform cross-section in the second direction (Y direction). The outer circumferential surface of the support 230 that meets or contacts the flexible display 300 may form a curved surface, and the cross-section of the support 230 may be formed in, for example, a circular or semi-circular shape.

In an embodiment, the support 230 may be formed in a cylindrical shape having a uniform cross-section in the second direction (Y direction). In addition, the support 230 may be formed in the shape of a roller which is capable of rotating in both directions about the central axis 231 parallel to the second direction. That is, the support 230 may be coupled to the second body 220 in a state in which the support 230 is capable of rotating by using the central axis 231 as a rotation axis.

Figure 4A:
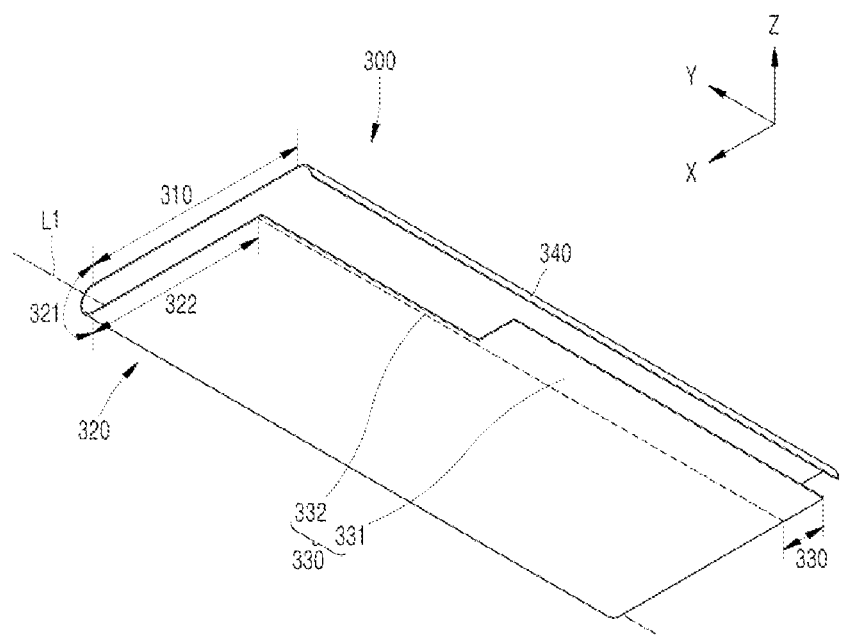
FIG. 4A is a perspective view illustrating a flexible display in the first state of the flexible display device.
Figure 4B:
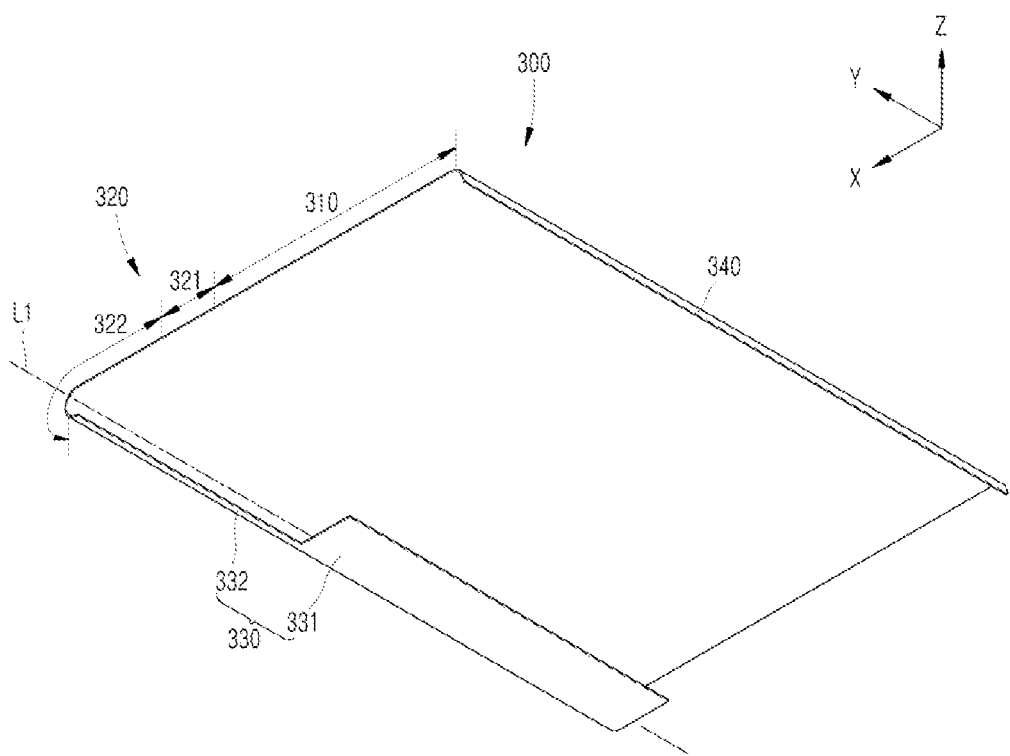
FIGS. 4B and 4C are perspective views illustrating a modified state (the second state) of the flexible display illustrated FIG. 4A, respectively.
Figure 4C:
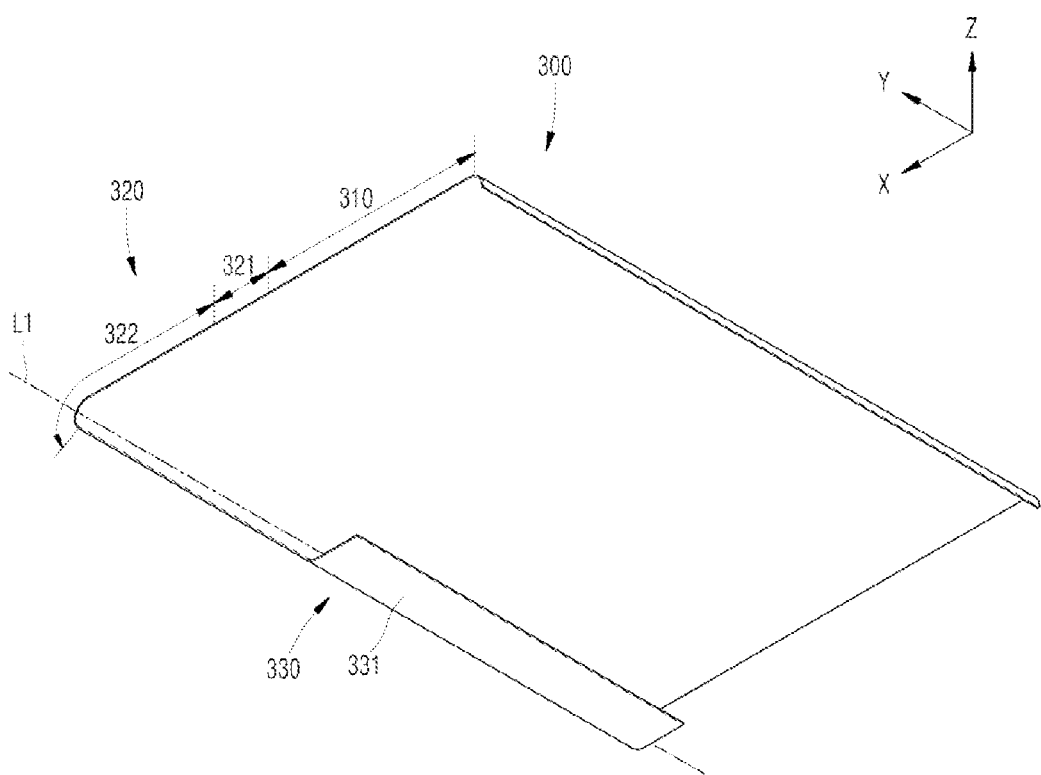

FIG. 4A is a perspective view illustrating a flexible display 300 separated from the flexible display device 1 in the first state, and FIGS. 4B and 4C are perspective views illustrating a modified state (second state) of the flexible display 300 illustrated in FIG. 4A, respectively.

FIG. 4A may illustrate the state in which the second body 220 is at the above-described first position relative to the first body 210, and FIGS. 4B and 4C may illustrate the state in which the second body 220 is at the above-described second position relative to the first body 210, respectively.

The flexible display 300 may be configured like the display 151 described above.

The flexible display 300 may be formed in the shape of a thin film, and may have an outer surface and an inner surface. The outer surface of the flexible display 300 is a surface facing the outside of the flexible display device 1, and the inner surface thereof is a surface facing the inside of the flexible display device 1. An image may be displayed on at least a portion of the outer surface of the flexible display 300.

Since at least a portion of the flexible display 300 may be formed to be curved, when the second body 220 moves relative to the first body 210, the flexible display 300 may change in shape. When switching from the first position to the second position is made, the middle part of the flexible display 300 is curved around the support 230, and the flexible display 300 changes in shape by being pushed by the support 230.

The flexible display 300 may include a first region 310, a second region 320, and a third region 330 that are sequentially connected to each other.

When the flexible display 300 is not coupled to the body 200 and is extended to be flat overall, the first region 310, the second region 320, and the third region 330 may all form the same plane.

In FIG. 2B, the dotted line b1 is an imaginary line indicating the boundary between the first region 310 and the second region 320 (a first connected region 321).

The first region 310 may have a predetermined area, and may be coupled to the body 200 at either side of the body 200. The first region 310 may be coupled to the first body 210, or may be fixed to the first body 210. That is, the first region 310 may not move relative to the first body 210.

The first region 310 may be parallel to the first and second directions. The first region 310 may be fixed in front of the first body 210. The first region 310 may be fixed in front of the first body 210 based on the third direction. The first region 310 and the first body 210 may be parallel to each other.

In an embodiment of the present disclosure, the first region 310 may form a curved surface overall. In this case, the curvature of the first region 310 may be smaller than the curvature of the first connected region 321 described below, and the radius of curvature of the first region 310 may be greater than the radius of curvature of the first connected region 321. The radius of curvature of the first region 310 may be sufficiently greater than the radius of curvature of the first connected region 321. For example, when the radius of curvature of the first connected region 321 is "a", the radius of curvature of the first region 310 may be "10*a" or greater.

In another embodiment of the present disclosure, the first region 310 may form a flat surface overall. The first region 310 may form an outer surface that is a flat surface, and may be disposed on the front surface of the body 200. The first region 310 may have a uniform cross-section in the first and second directions.

Hereinafter, the flexible display device 1 will be described on the assumption that the first region 310 is formed in a flat surface.

The facing direction of the first region 310 (the facing direction of the outer surface of the first region 310) may be the third direction. The first region 310 may form a part or the entirety of the first surface 1a of the flexible display device 1.

The flexible display 300 may further include a fourth area 340.

The fourth region 340 may be configured to extend from the first region 310, and may form an end of the flexible display 300. The fourth region 340 may have a uniform cross-section and be curved, in the second direction. An image may be displayed on the fourth region 340.

The second region 320 is configured to extend from the first region 310, and a part of second region 320 is curved around the support 230. The second region 320 may have a uniform cross-section in the second direction.

The second region 320 may include the first connected region 321 and a second connected region 322.

The first connected region 321 may be directly coupled to the first region 310, and the second connected region 322 may be directly coupled to the first connected region 321 and the third region 330.

When the second body 220 is at the first position, the first connected region 321 is curved around the support 230 along the outer circumferential surface of the support 230. When the second body 220 is at the first position, the first connected region 321 may form an outer surface that is curved about a curvature center line L1. When the second body 220 is at the first position, the curvature center line L1 is an imaginary straight line that forms a center of curvature of the first connected region 321, and is parallel to the second direction.

When the second body 220 is at the first position, a cross-section of the first connected region 321 may form a semicircular shape.

The curvature center line L1 may coincide with the central axis 231 of the support 230.

When the second body 220 is at the second position, the curvature center line L1 may form a center of curvature of the curved second connected region 322.

An image may be displayed on the first connected region 321 and the first region 310.

The area of the first region 310 may be larger than that of the first connected region 321.

When the second body 220 is at the first position, the second connected region 322 may form an outer surface that is an opposite surface of the first region 310. That is, when the second body 220 is at the first position, when the first region 310 faces the third direction (Z direction), the second connected region 322 may face the direction opposite to the third direction (Z direction). An image may be displayed on the second connected region 322.

The second connected region 322 may form a part of the second surface 1b of the flexible display device 1.

The second connected region 322 may have a uniform cross-section in the second direction. When the second body 220 is at the first position, the second connected region 322 may have a uniform cross-section in the first direction.

The flexible display 300 is configured such that the first region 310, the first connected region 321, and the second connected region 322 are sequentially coupled to each other, and when the second body 220 is at the first position, the first region 310, the first connected region 321, and the second connected region 322 may be formed in a U-shape overall.

In an embodiment of the present disclosure, when the second body 220 is at the first position, the second connected region 322 may form a curved surface overall. In this case, the curvature of the second connected region 322 may be smaller than the curvature of the first connected region 321, and the radius of curvature of the second connected region 322 may be greater than the radius of curvature of the first connected region 321. The radius of curvature of the second connected region 322 may be sufficiently greater than the radius of curvature of the first connected region 321. For example, when the radius of curvature of the first connected region 321 is "a", the radius of curvature of the second connected region 322 may be "10*a" or greater.

In another embodiment of the present disclosure, when the second body 220 is at the first position, the second connected region 322 may form a flat surface overall. In addition, the second connected region 322 may be parallel to the first region 310. Hereinafter, the flexible display device 1 will be described on the assumption that when the second body 220 is at the first position, the second connected region 322 is formed in a flat surface and is parallel to the first region 310.

The third region 330 is configured to extend from the second region 320 on the opposite side of the first region 310. The third region 330 may be configured to extend from the second connected region 322, and may form an end of the flexible display 300.

In the flexible display 300, an image may be displayed on the surfaces of the first region 310, the second region 320, and the fourth region 340, but not on the surface of the third region 330. In the flexible display 300, the third region 330 may form an extended part of a display substrate, and may form a dummy part on which an image is not displayed.

The third region 330 may be formed separately from the flexible display 300 and then be coupled to the flexible display 300, or may be integrally formed with the flexible display 300 in the manufacturing process of the flexible display 300. The third region 330 may be formed as a substrate of the flexible display 300.

The third region may be formed in the shape of a plastic film, and may be flexibly curved.

At least one camera 122 is fixed to a rear surface of the body 200. The camera 122 may be coupled to the body 200 to face the direction opposite to the third direction (Z direction).

The camera 122 may be fixed to a rear surface of the first body 210.

The camera 122 may be fixed to the body 200 away from the support 230. That is, when the support 230 is coupled to the body 200 on the left side of the flexible display device 1, the camera 122 is coupled to the body 200 on the right side of the flexible display device 1. The camera 122 may be fixed adjacent to an edge of the first body 210 farthest from the support 230.

Two or more cameras 122 may be arranged in the second direction.

Figure 5A:
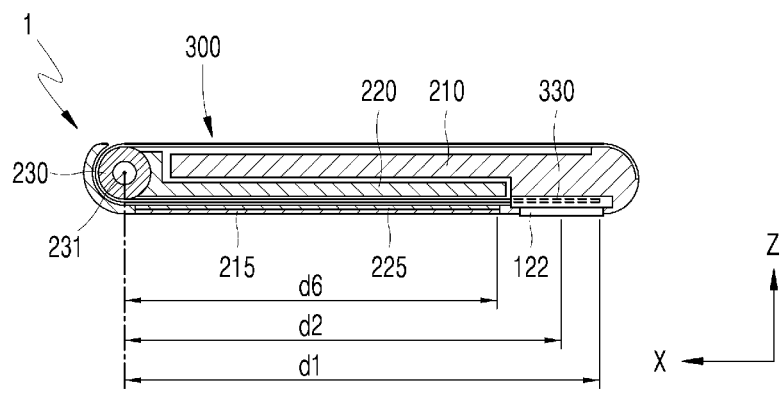
FIG. 5A is a cross-sectional view taken along line A-A' of FIG. 3A, and schematically illustrates a flexible display device.
Figure 5B:
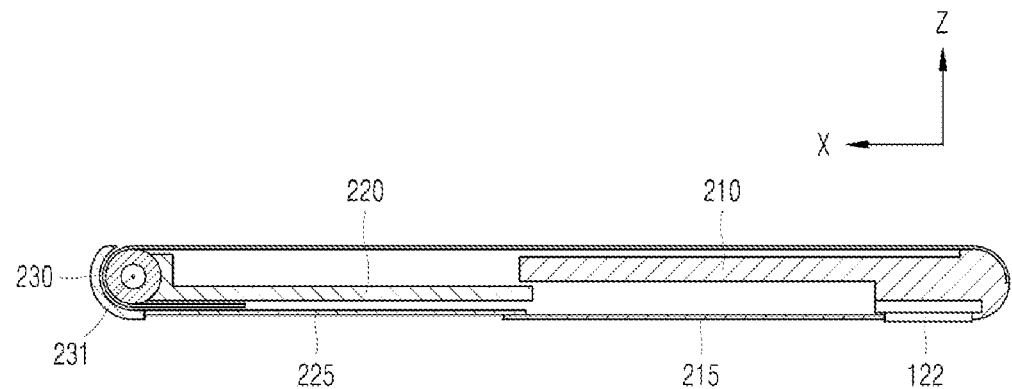
FIG. 5B is a cross-sectional view taken along line B-B' of FIG. 3B, and schematically illustrates a flexible display device.

FIG. 5A is a cross-sectional view taken along line A-A' of FIG. 3A, and schematically illustrates the flexible display device 1. FIG. 5B is a cross-sectional view taken along line B-B' of FIG. 3B, and schematically illustrates the flexible display device 1. However, FIGS. 5A and 5B illustrate a state in which a first cover 215 and a second cover 225 are additionally coupled to the flexible display device 1.

Figure 6A:
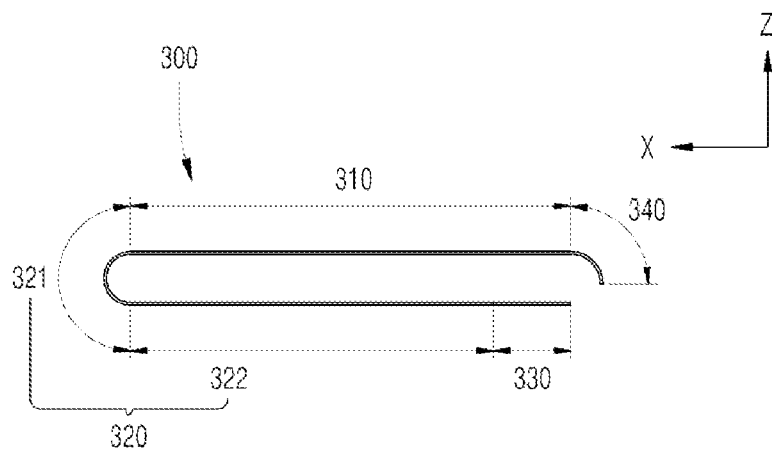
FIG. 6A is a cross-sectional view illustrating a flexible display separated from the flexible display device illustrated in FIG. 5A.
Figure 6B:
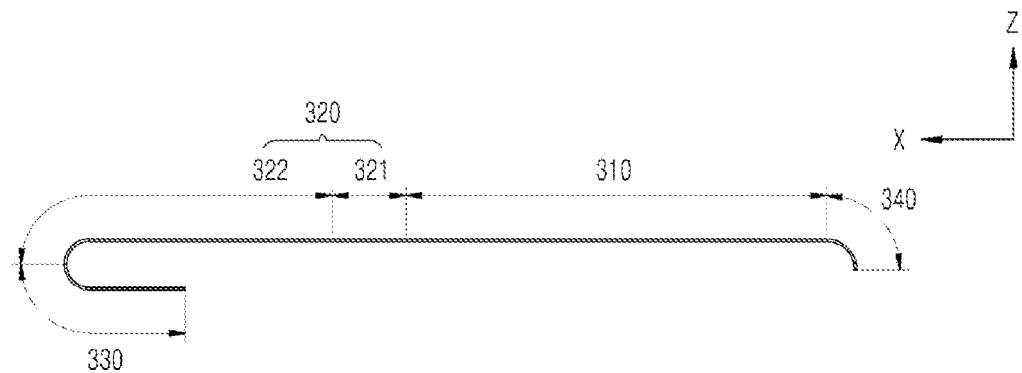
FIG. 6B is a cross-sectional view illustrating the flexible display separated from the flexible display device illustrated in FIG. 5B.

FIG. 6A is a cross-sectional view illustrating the flexible display 300 separated from the flexible display device 1 illustrated in FIG. 5A, and FIG. 6B is a cross-sectional view illustrating the flexible display 300 separated from the flexible display device 1 illustrated in FIG. 5B.

The first body 210 may include the first cover 215. The first cover 215 may be formed in the shape of a flat plate to form a rear surface of the first body 210. The first cover 215 may be fixed to or detachably coupled to the first body 210. The first cover 215 may be made transparent or non-transparent.

The second body 220 may include the second cover 225. The second cover 225 may be formed in the shape of a flat plate to form a rear surface of the second body 220. The second cover 225 may be fixed to or detachably coupled to the second body 220. The second cover 225 may be made transparent or non-transparent.

When the second body 220 is at the first position, the first cover 215 and the second cover 225 overlap each other. However, when switching from the first position to the second position is made, the first cover 215 and the second cover 225 perform sliding movement relative to each other.

The first cover 215 and the second cover 225 may form a rearmost surface of the flexible display device 1.

When the second body 220 is at the first position, based on the first direction, the distance d1' from the support 230 to an edge of at least a portion of the third region 330 may be greater than the distance d2' from the support 230 to the camera 122.

When the second body 220 is at the first position, based on the first direction, the distance d1 from the support 230 to an end of the third region 330 may be equal to or greater than the distance d2 from the support 230 to a center of the camera 122 (see FIGS. 3A and 5A).

When the second body 220 is at the first position, the third region 330 may be located in the same line as the camera 122 in the second direction when viewed from the third direction.

When the second body 220 is at the second position, the third region 330 may be located in the same line as the support 230 in the second direction when viewed from the third direction.

When the second body 220 is at the second position, the first connected region 321 may form the same plane with the first region 310, and at least a portion of the second connected region 322 may be curved around the support 230 in the circumferential direction of the support 230. When the second body 220 is at the second position, a part of the second connected region 322 may form the same plane with the first region 310.

When the second body 220 is at the second position, the first connected region 321 may be located in front of the second body 220, and a part of the second connected region 322 may also be located in front of the second body 220.

Accordingly, a significant portion of the second region 320 located behind the second body 220 when the second body 220 is at the first position may move to the front of the second body 220 when the second body 220 is at the second position. In addition, an area of the second region 320 located in front of the second body 220 may be larger when the second body 220 is at the second position than when the second body 220 is at the first position.

When the second body 220 is at the second position, based on the third direction, the third region 330 may be located behind the support 230. When the second body 220 is at the second position, a part of the third region 330 may be curved around the support 230 and a remaining part thereof may be parallel to the first region 310.

When the second body 220 performs reciprocating movement relative to the first body 210 between the first position and the second position, an area of the flexible display 300 viewed from the third direction (Z direction) may be increased or reduced.

In the flexible display device 1, when viewed from the third direction (Z direction), a projection area of the flexible display 300 may be larger when the second body 220 is at the second position than when the second body 220 is at the first position.

When the second body 220 is at the first position, the first connected region 321 may be curved to form a curved surface around the support 230, the second connected region 322 may be parallel to the first region 310, and the third region 330 may be located in the same line as the camera 122 in the second direction when viewed from the third direction.

When the second body 220 moves relative to the first body 210 such that switching from the first position to the second position is made, the first connected region 321 may form the same plane with the first region 310, and a part of the second connected region 322 may be curved to form a curved surface around the support 230.

In addition, when the second body 220 is at the second position, the third region 330 may be located in the same line as the support 230 in the second direction when viewed from the third direction.

In order to achieve a stable modification of the flexible display 300 when switching back from the second position to the first position is made, as will be described below, the third region 330 may be coupled to a tension generator (also referred to as a tensioner) 400, and at least a portion of the third region 330 is located behind the support 230 based on the third direction.

When the second body 220 moves relative to the first body 210 such that switching from the second position to the first position is made, the first connected region 321 may be curved around the support 230 again, and the second connected region 322 may form a plane parallel to the first region 310.

When switching from the first position to the second position is made, the movement distance d3 of the third region 330 is twice the movement distance d4 of the second body 220.

When switching from the first position to the second position is made, the movement distance d5 of the third region 330 relative to the second body 220 may be equal to or greater than the distance d6 of the second connected region 322 based on the first direction when the second body 220 is at the first position, and the extent (length) of screen expansion of the flexible display 300 when viewed from the third direction (Z direction) may correspond to the movement distance d5.

In FIG. 3A, the dashed-dotted line b2 is an imaginary line indicating the boundary between the second region 320 and the third region 330.

As described above, in the flexible display device 1, when the second body 220 is at the first position, based on the first direction, the distance d1 from the support 230 to an end of the third region 330 is equal to or greater than the distance d2 from the support 230 to a center of the camera 122, and when the second body 220 is at the second position, the third region 330 may move to the support 230.

Accordingly, when the second body 220 is at the second position, the first connected region 321 may form the same plane with the first region 310, as well as maximizing the size (area) of the second region 320 forming the same plane with the first region 310.

Unlike the embodiments of the present disclosure, if the flexible display includes only the first region 310 and the second region 320 and not the third region 330, when switching from the first position to the second position is made, the extent (length) of screen expansion of the flexible display when viewed from the third direction (Z direction) is smaller than that of the embodiments of the present disclosure. The reason for this is that, when the flexible device does not include the third region 330, a part of the second connected region 322 must be located behind the support 230 based on the third direction and form a flat surface, in order to cause switching back from the second position to the first position to be made.

According to an embodiment of the present disclosure, since the flexible display device 1 may be configured such that the camera 122 may be mounted on the rear surface thereof and an exposed area of the flexible display 300 on the front surface thereof may continuously change, the exposed area of the flexible display 300 on the front surface of the flexible display device 1 can be further increased.

Figure 7A:
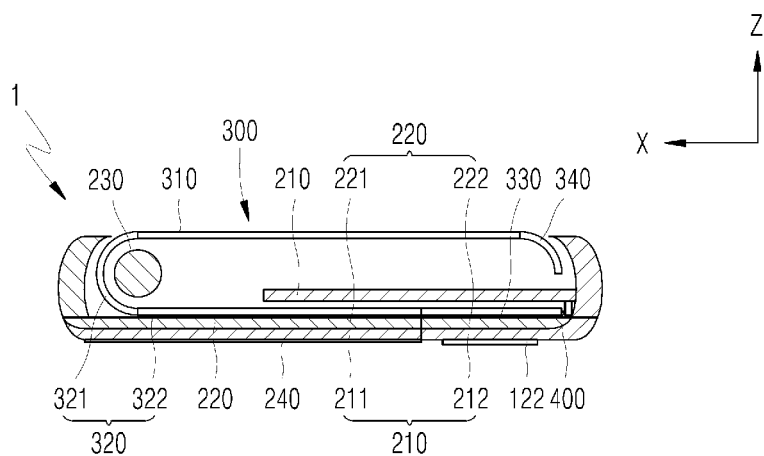
FIG. 7A is a cross-sectional view schematically illustrating a flexible display device.
Figure 7B:
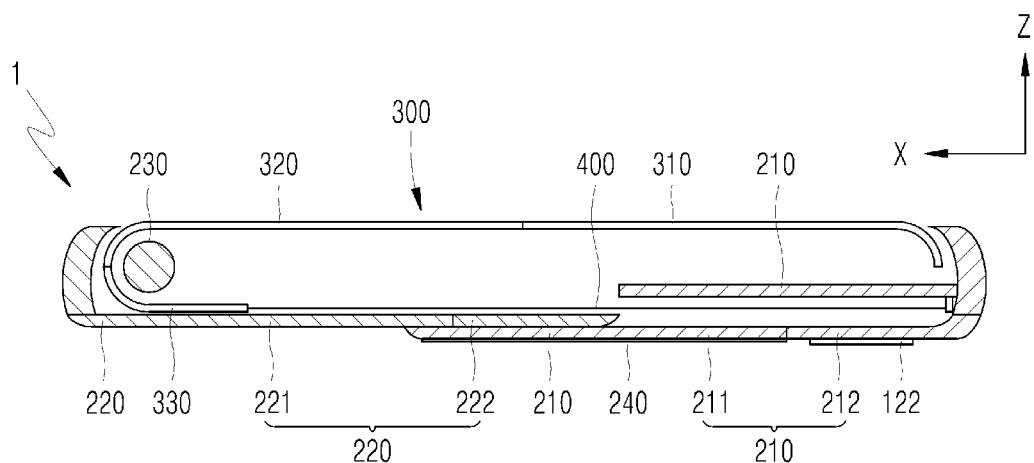
FIG. 7B is a cross-sectional view illustrating a state in which the flexible display device illustrated in FIG. 7A is modified.

FIG. 7A is a cross-sectional view schematically illustrating the flexible display device 1, and FIG. 7B is a cross-sectional view illustrating a state in which the flexible display device 1 illustrated in FIG. 7A is modified.

Figure 8A:
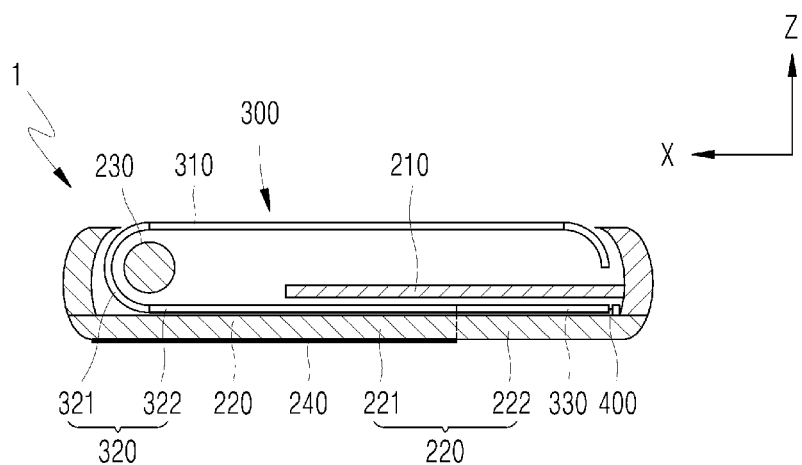
FIG. 8A is a cross-sectional view schematically illustrating a flexible display device.
Figure 8B:
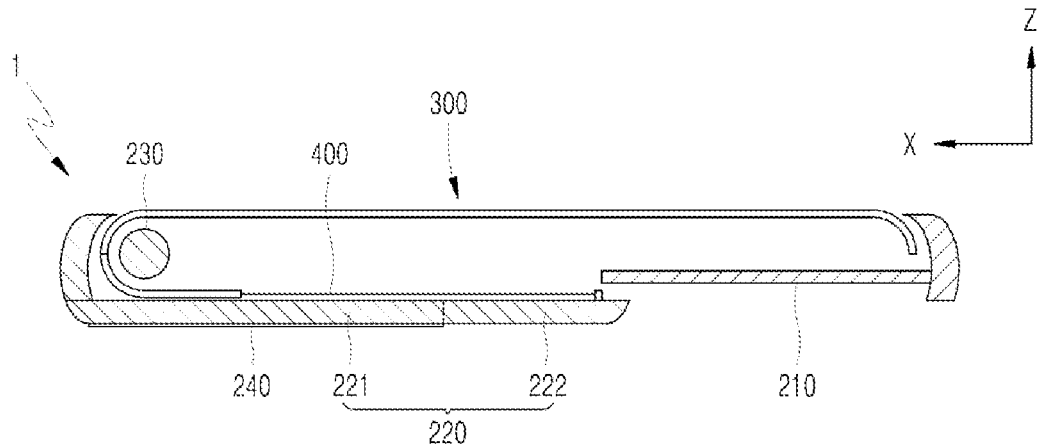
FIG. 8B is a cross-sectional view illustrating a state in which the flexible display device illustrated in FIG. 8A is modified.

FIG. 8A is a cross-sectional view schematically illustrating the flexible display device 1, and FIG. 8B is a cross-sectional view illustrating a state in which the flexible display device 1 illustrated in FIG. 8A is modified.

An outer surface of the first body 210 and an outer surface of the second body 220 may together form the rear surface of the flexible display device 1. That is, when viewed from the direction opposite to the third direction, both the outer surface of the first body 210 and the outer surface of the second body 220 may be seen.

At least a portion of the first body 210 may be made transparent. Accordingly, stacked components inside the first body 210 may be visually exposed to the outside (back).

At least a portion of the second body 220 may also be made transparent. Accordingly, stacked components inside the second body 220 may be visually exposed to the outside (back).

The first body 210 may include a first transparent region 211 and a first non-transparent region 212. The first transparent region 211 and the first non-transparent region 212 may form the rear surface of the flexible display device 1. The first transparent region 211 and the first non-transparent region 212 may form the first cover 215 described above.

The first transparent region 211 may be made transparent using materials such as transparent plastic and glass. When the second body 220 is at the first position, when viewed from the third direction (Z direction), the first transparent region 211 may overlap the second region 320, and may overlap the second connected region 322.

The first non-transparent region 212 is made non-transparent. When the second body 220 is at the first position, when viewed from the third direction (Z direction), the first non-transparent region 212 may overlap the third region 330.

The third region 330 may be formed in a dummy form so as not to display an image, and the first non-transparent region 212 may overlap the third region 330 to prevent unnecessary exposure of the inside of the flexible display device 1.

The second body 220 may include a second transparent region 221 and a second non-transparent region 222. The second transparent region 221 and the second non-transparent region 222 may form the rear surface of the flexible display device 1. The second transparent region 221 and the second non-transparent region 222 may form the second cover 225 described above.

The second transparent region 221 may be made transparent using materials such as transparent plastic and glass. When the second body 220 is at the first position, when viewed from the third direction (Z direction), the second transparent region 221 may overlap the second region 320, and may overlap the second connected region 322.

The second non-transparent region 222 is made non-transparent. When the second body 220 is at the first position, when viewed from the third direction (Z direction), the second non-transparent region 222 may overlap the third region 330. As described above, the third region 330 may be formed in a dummy form so as not to display an image, and the second non-transparent region 222 may overlap the third region 330 to prevent unnecessary exposure of the inside of the flexible display device 1.

The flexible display 300 (the second region 320 and the third region 330) may be formed to move inside the first body 210 and the second body 220. In an embodiment of the present disclosure, the second body 220 may be located behind the flexible display 300 (the second region 320 and the third region 330), and the first body 210 may be located behind the second body 220.

As described above, the first transparent region 211 and the second transparent region 221 may be made transparent to cause the second region 320 to be visually exposed to the outside. Accordingly, an image on the second region 320 may be viewed from behind the flexible display device 1, through the first transparent region 211 and the second transparent region 221.

When the first body 210 includes the first transparent region 211 and the second body 220 includes the second transparent region 221, the flexible display device 1 may include a touch panel 240. In this case, the touch panel 240 may be coupled to the first transparent region 211 by being stacked thereon, or may be coupled to the outer or inner surface of the first transparent region 211. The touch panel 240 may be formed as a touch sensor.

In addition, the touch panel 240 may have the same area as the first transparent region 211 so as to be perfectly coupled thereto. When the second body 220 is at the first position, the second connected region 322, the second transparent region 221, the first transparent region 211, and the touch panel 240 may be arranged to overlap each other, the second region 320 and the touch panel 240 may be combined to form a touch screen, and touch input (information input) may be performed through the second region 320.

The flexible display 300 (the second region 320 and the third region 330) may move between the first body 210 and the second body 220. In an embodiment of the present disclosure, the flexible display 300 (the second region 320 and the third region 330) may be located behind the first body 210, and the second body 220 may be located behind the flexible display 300 (the second region 320 and the third region 330). Furthermore, in this case, the second body 220 may include the second transparent region 221 and the second non-transparent region 222.

In addition, the flexible display device 1 may further include the touch panel 240 that is coupled to the second transparent region 221. The touch panel 240 may be coupled to the second transparent region 221 by being stacked thereon, or may be coupled to the outer or inner surface of the second transparent region 221. The touch panel 240 may have the same area as the second transparent region 221 so as to be perfectly coupled thereto. When the second body 220 is at the first position, the second region 320, the second transparent region 221, and the touch panel 240 may be arranged to overlap each other, the second region 320 and the touch panel 240 may be combined to form a touch screen, and touch input (information input) may be performed through the second region 320.

Figure 9A:
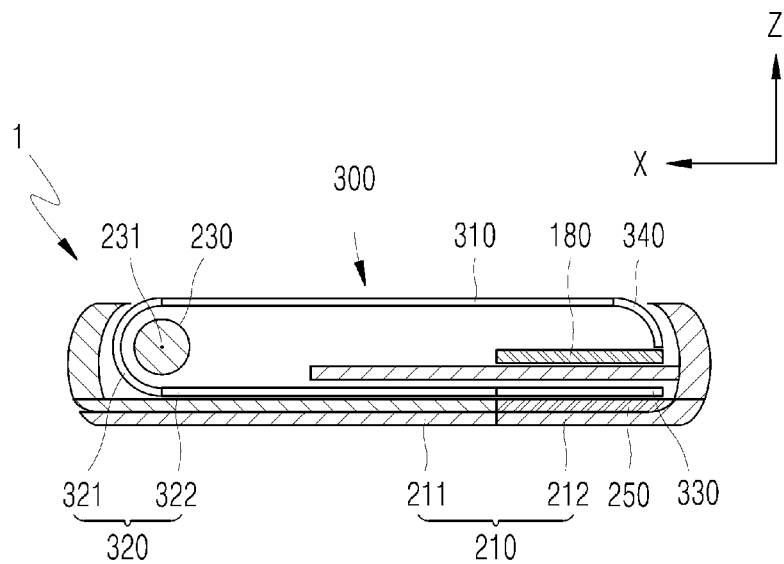
FIG. 9A is a cross-sectional view illustrating a flexible display device.
Figure 9B:
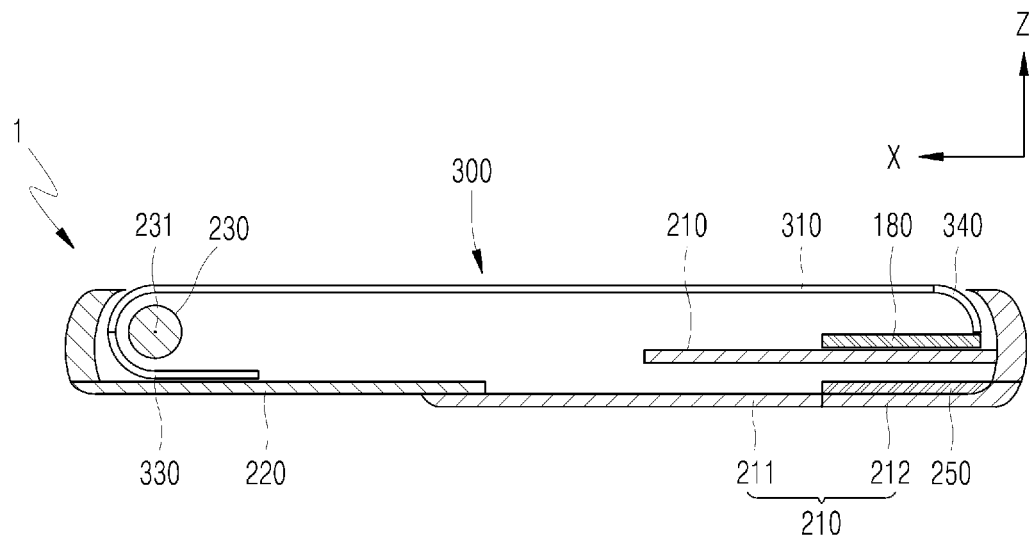
FIG. 9B is a cross-sectional view illustrating a state in which the flexible display device illustrated in FIG. 9A is modified.
Figure 9C:
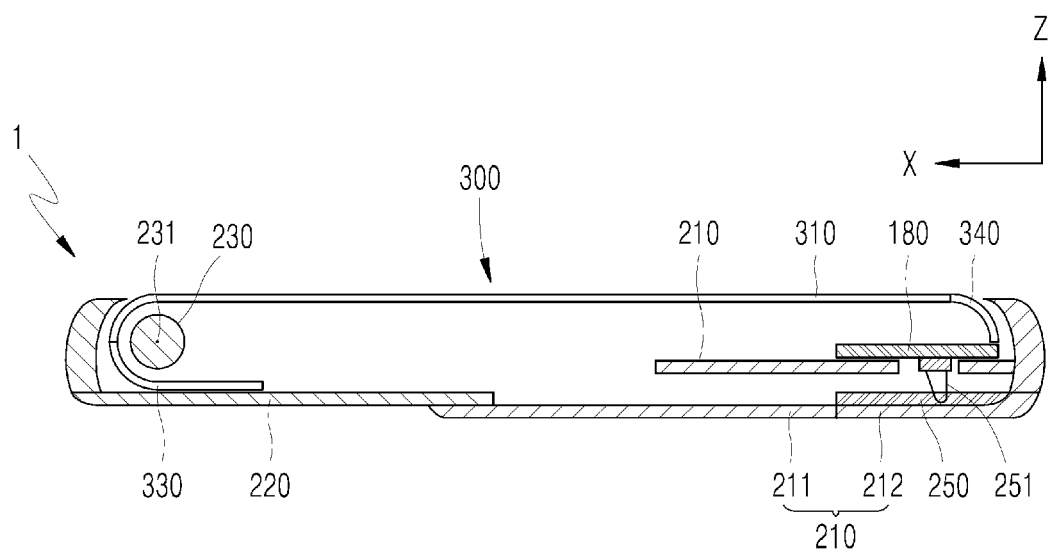
FIG. 9C is a cross-sectional view illustrating the flexible display device.

FIG. 9A is a cross-sectional view illustrating the flexible display device 1, FIG. 9B is a cross-sectional view illustrating a state in which the flexible display device 1 illustrated in FIG. 9A is modified, and FIG. 9C is a cross-sectional view illustrating the flexible display device 1.

When the second body 220 is at the first position, the inner surface of the first body 210 may face the outer surface of the second body 220. That is, the first body 210 and the second body 220 may be combined in a stacked manner such that the first body 210 is located behind the second body 220.

The flexible display device 1 may be configured to further include a wireless transmission/reception part 250.

The wireless transmission/reception part 250 may include, for example, an antenna, a wireless communication module, and/or a wireless charging module, and may be formed like the wireless transceiver 110 described above. Accordingly, the flexible display device 1 may perform wireless charging or wireless communication through the wireless transmission/reception part 250.

The wireless transmission/reception part 250 overlaps with the third region 330 when viewed from the third direction, and is fixed to the inner surface of the first body 210. The first body 210 may include the first transparent region 211 and the first non-transparent region 212, as described above, and the wireless transmission/reception part 250 may be located inside the first non-transparent region 212.

In the flexible display device 1, the controller 180 may be fixed inside the first body 210, and may include a PCB substrate. Since the flexible display 300 may be electrically coupled to the controller 180 through the first region 310 or the fourth region 340 that is fixed to the first body 210, and the wireless transmission/reception part 250 fixed to the first body 210 may also be fixedly coupled to the controller 180, when the second body 220 moves relative to the first body 210, the connection between the controller 180 and the flexible display 300 or between the controller 180 and the wireless transmission/reception part 250 may be stably performed.

The wireless transmission/reception part 250 may be electrically connected to the controller 180 while avoiding the first body 210, or may be electrically connected to the controller 180 through a connection terminal 251 that passes through the first body 210.

Furthermore, the wireless transmission/reception part 250 may overlap the first non-transparent region 212 to prevent visual exposure of the wireless transmission/reception part 250 to the outside, and may be coupled directly inside the first body 210 forming the rearmost surface to effectively perform wireless charging or wireless communication.

Figure 10A:
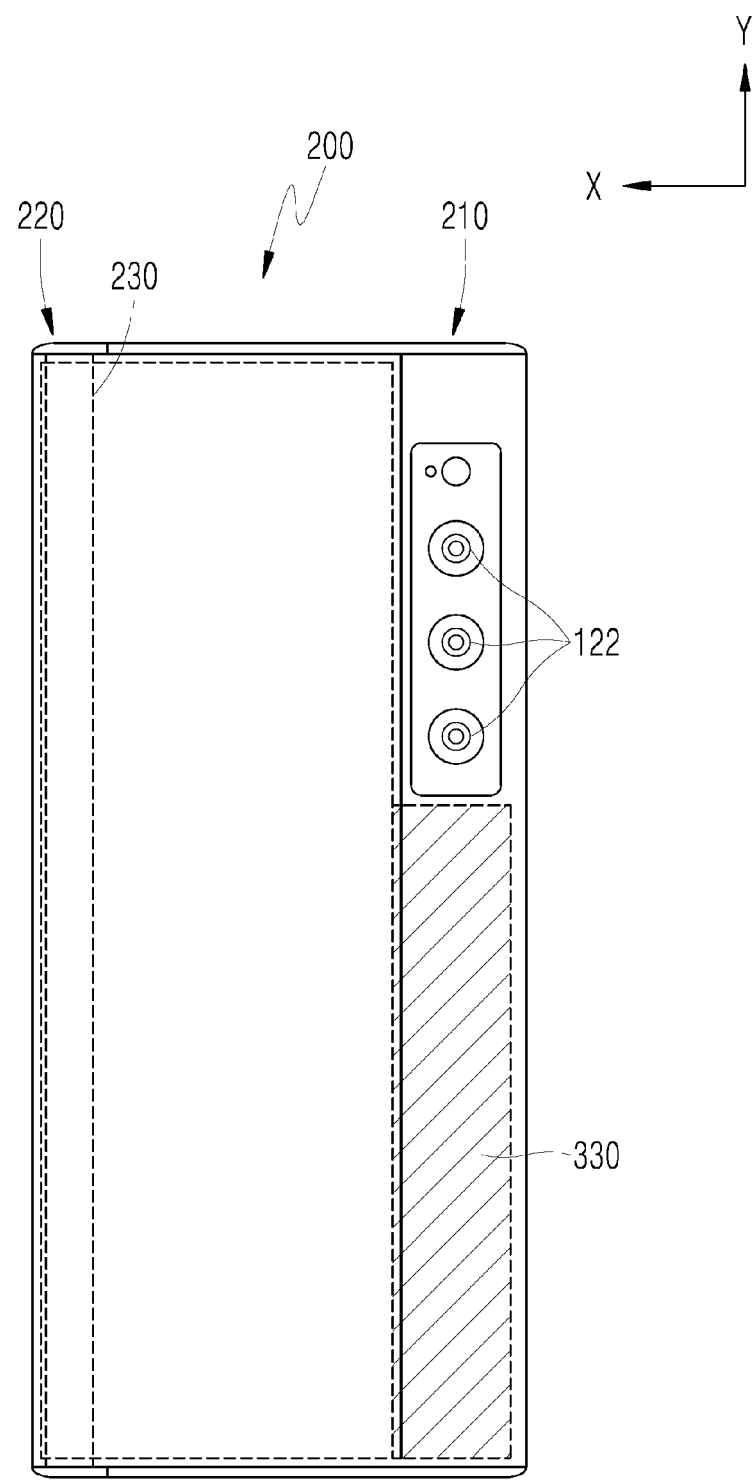
FIGS. 10A and 10B are rear views illustrating a flexible display device, respectively.
Figure 10B:
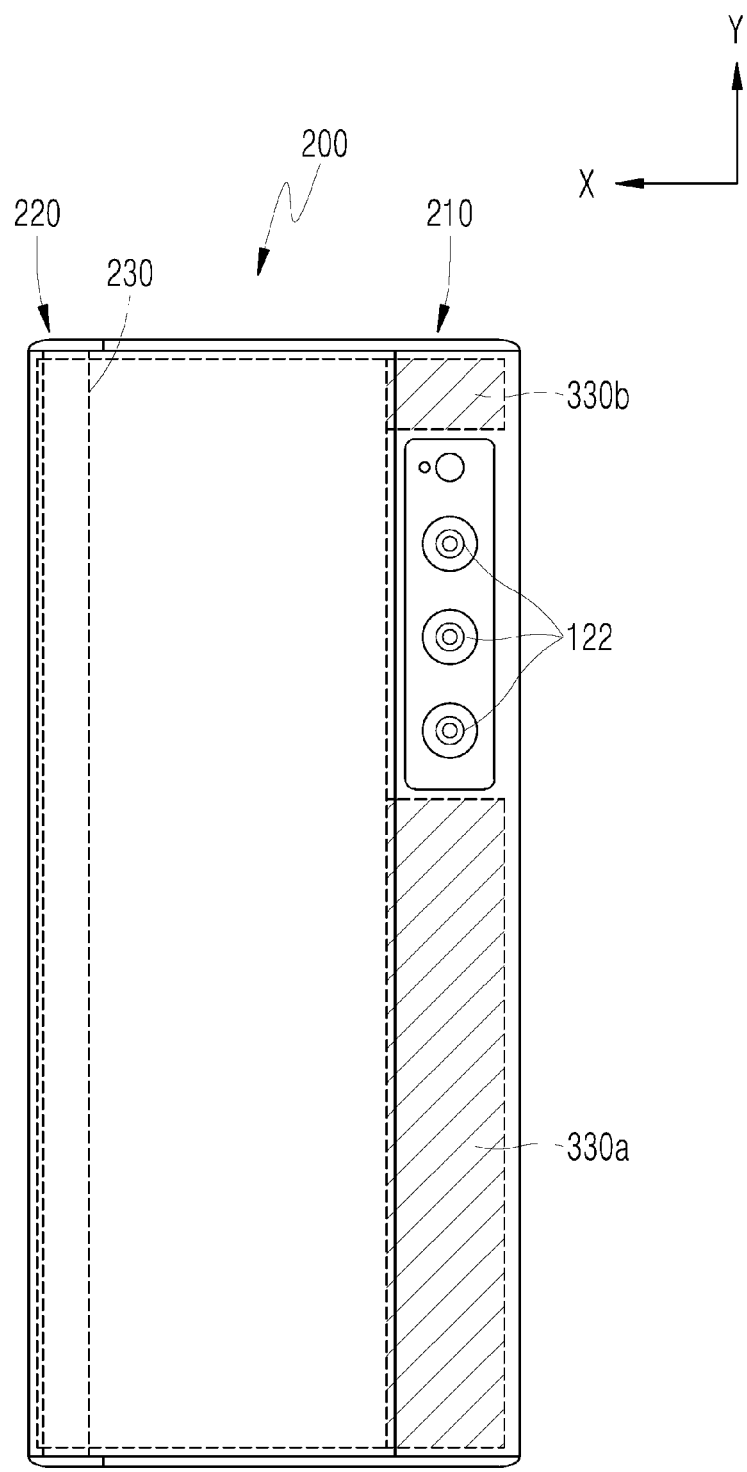

FIGS. 10A and 10B are rear views illustrating the flexible display device 1, respectively. In FIGS. 10A and 10B, the support 230 and the flexible display 300 are represented by dotted lines.

When the second body 220 is at the first position, the third region 330 may be located at any one side of the camera 122 (see FIG. 10A).

Alternatively, when the second body 220 is at the first position, the third region 330 may be located at both sides of the camera 122 (see FIG. 10B). That is, the third region 330 may be divided into two parts 300a and 300b. As a result, when switching from the first position to the second position is made, it is possible to prevent or alleviate eccentricity acting on the flexible display 300.

The flexible display device 1 may include the tension generator 400 (see FIGS. 7A to 8B).

The tension generator 400 is configured to pull the flexible display 300 to apply tension to the flexible display 300.

The tension generator 400 may be coupled to the third region 330 of the flexible display 300 by being coupled to the body 200, and may increase the tension applied to the flexible display 300, when switching from the first position to the second position is made.

In an embodiment, the tension generator 400 may include a spring.

The tension generator 400 may be configured to couple the first body 210 to the third region 330, and to apply an external force to the flexible display 300 to cause the third region 330 to move away from the support 230 again, when the third region 330 approaches the support 230 in the first direction. That is, the tension generator 400 may be configured to pull the third region 330 to cause the third region 330 to be close to the camera 122 in the first direction.

The tension generator 400 may be configured to couple the second body 220 to the third region 330, and to apply an external force to the flexible display 300 to cause the third region 330 to move away from the support 230 again, when the third region 330 approaches the support 230 in the first direction. That is, the tension generator 400 may be configured to pull the third region 330 to cause the third region 330 to be close to the camera 122 in the first direction.

Figure 11A:
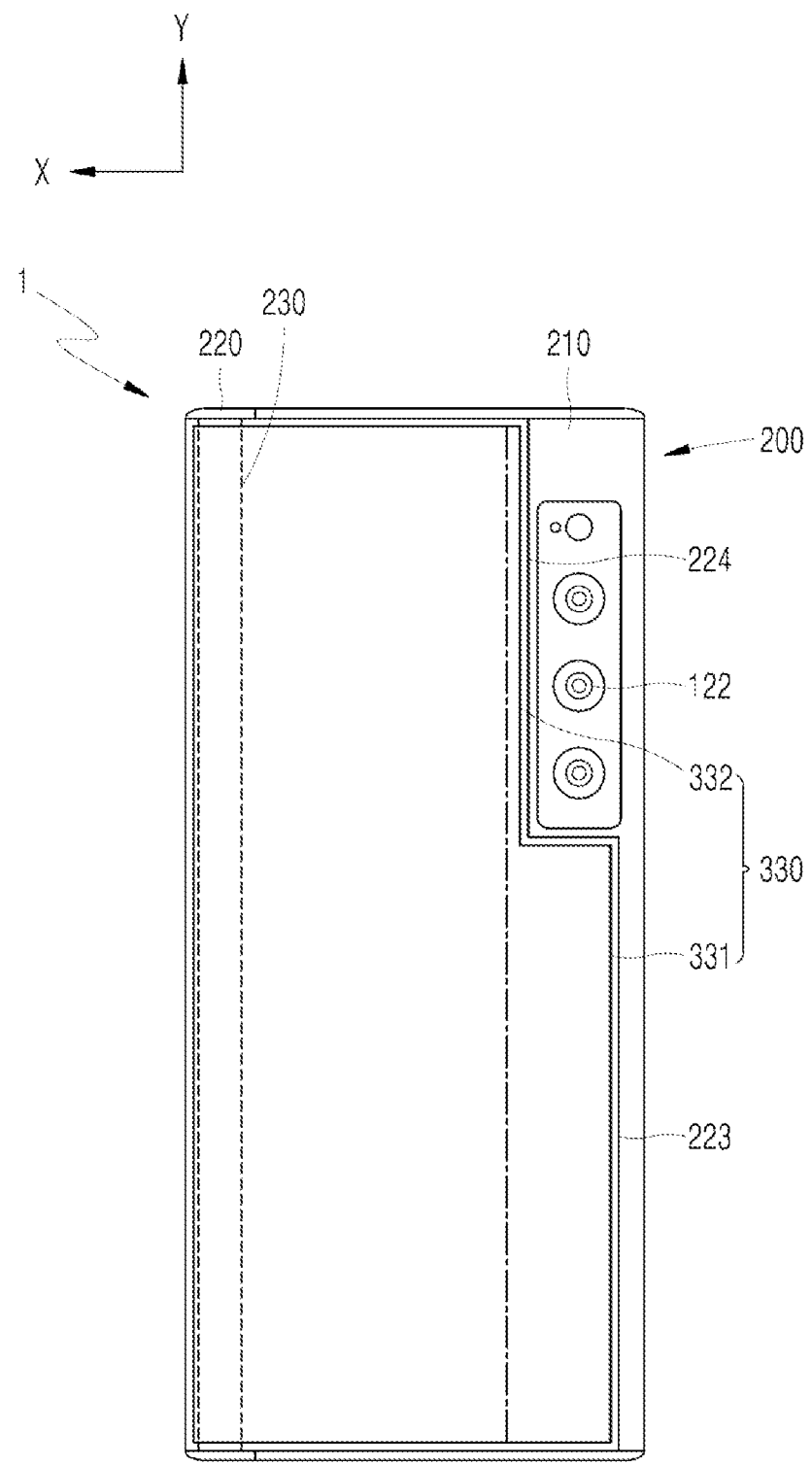
FIG. 11A is a rear view illustrating a flexible display device.
Figure 11B:
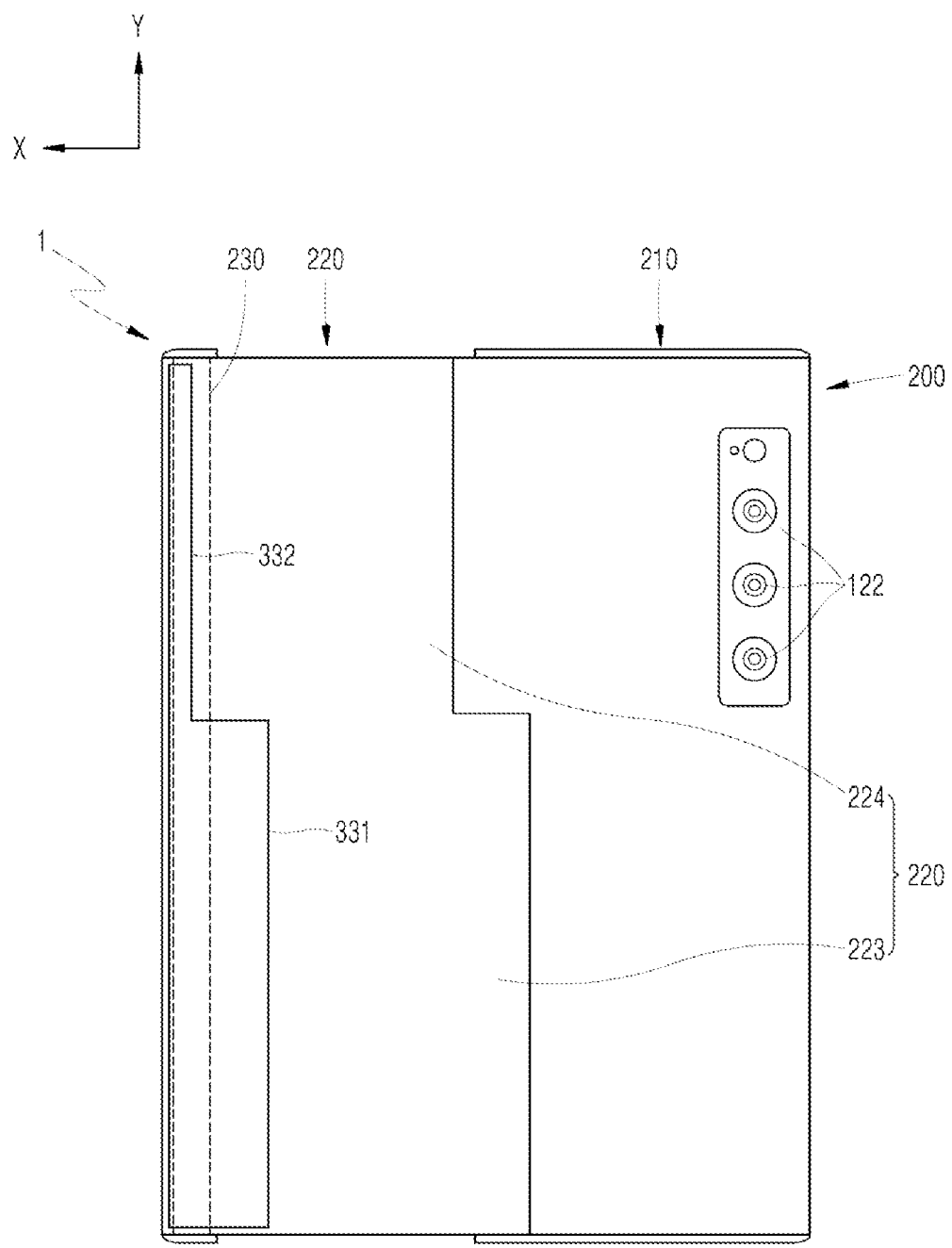
FIG. 11B is a rear view illustrating a state in which the flexible display device illustrated in FIG. 11A is modified.

FIG. 11A is a rear view illustrating the flexible display device 1, and FIG. 11B is a rear view illustrating a state in which the flexible display device 1 illustrated in FIG. 11A is modified.

Figure 12A:
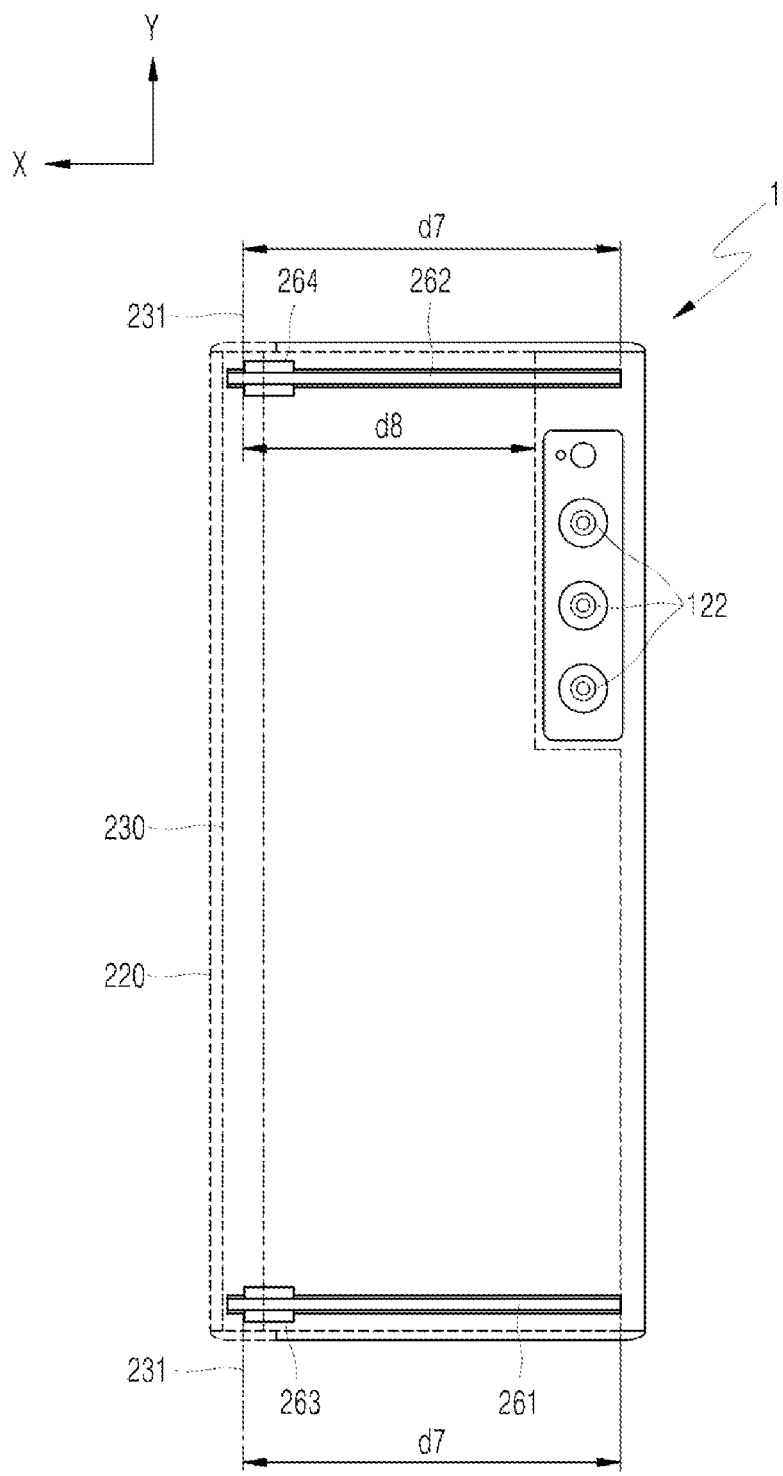
FIG. 12A is a rear view illustrating a flexible display device.
Figure 12B:
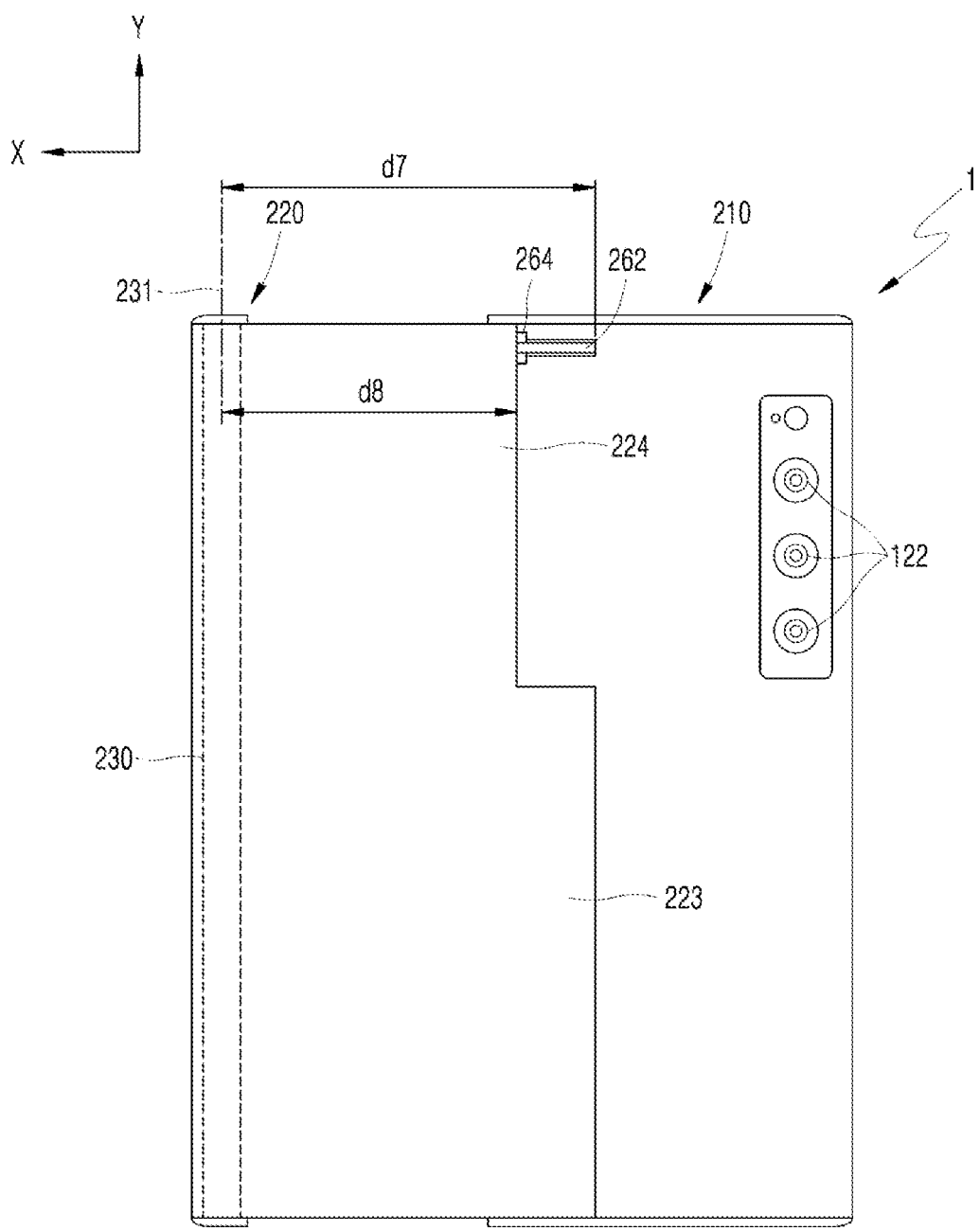
FIG. 12B is a rear view illustrating a state in which the flexible display device illustrated in FIG. 12A is modified.

FIG. 12A is a rear view illustrating the flexible display device 1, and FIG. 12B is a rear view illustrating a state in which the flexible display device 1 illustrated in FIG. 12A is modified.

In FIG. 12A, the second body 220 is represented by a dotted line, and in FIGS. 11A through 12B, the support 230 is represented by a dotted line.

The third region 330 may include a first end region 331 and a second end region 332.

When the second body 220 is at the first position, when viewed from the third direction, the first end region 331 may be formed in the same line as the camera 122 in the second direction, and may have a uniform width in the second direction.

When viewed from the third direction, the second end region 332 may be formed in the same line as the camera 122 in the first direction, may have a uniform width in the second direction, and may be coupled to the first end region 331.

In the second direction, the first end region 331 has a relatively wide width, but the second end region 332 has a relatively narrow width.

Based on the third direction, the second body 220 may be located behind the first body 210, and the second body 220 may include a first support region 223 and a second support region 224.

When the second body 220 is at the first position, the first support region 223 may overlap the first end region 331 to support the first end region 331.

When the second body 220 is at the first position, the second support region 224 may overlap the second end region 332 to support the second end region 332.

In order to enable the first body 210 and the second body 220 to perform relative movement (sliding movement), the flexible display device 1 may be configured to further include a first rail 261, a second rail 262, a first slider 263, and a second slider 264.

The first rail 261 is configured to extend in the first direction and to be fixed to the first support region 223 away from the second support region 224. The first rail 261 may have a uniform cross-section in the first direction.

The second rail 262 is configured to extend in the first direction and to be fixed to the second support region 224 away from the first support region 223. The second rail 262 may have a uniform cross-section in the first direction. The second rail 262 may be symmetric with the first rail 261 and may be the same as the first rail 261.

The first slider 263 is coupled to the first rail 261 to perform sliding movement along the first rail 261, and is fixed to the first body 210. Based on the first slider 263, the first rail 261 performs reciprocating movement in the first direction.

The second slider 264 is coupled to the second rail 262 to perform sliding movement along the second rail 262, and is fixed to the first body 210. Based on the second slider 264, the second rail 262 performs reciprocating movement in the first direction.

The first slider 263 and the second slider 264 are fixed to the first body 210 away from the camera 122. For example, when the camera 122 is coupled to the first body 210 on the right side of the flexible display device 1, the first slider 263 and the second slider 264 are coupled to the first body 210 on the left side of the flexible display device 1.

Based on the first direction, the distance d7 from the support 230 to ends of the first rail 261 and the second rail 262 may be greater than the distance d8 from the support 230 to an end of the second support region 224, respectively.

As described above, the third region 330 of the flexible display 300 includes the first end region 331 and the second end region 332, and the second body 220 includes the first support region 223 and the second support region 224. As a result, the flexible display device 1 may be configured such that protection and support of the flexible display 300 can be achieved by the second body 220 and an exposed area of the flexible display 300 on the front surface of the flexible display device 1 can be further increased, without the flexible display 300 interfering with the camera 122.

In addition, since, based on the first direction, the distance from the support 230 to ends of the first rail 261 and the second rail 262 may be greater than the distance from the support 230 to an end of the second support region 224, respectively, the range (stroke) of movement of the second body 220 relative to the first body 210 can be increased, and the area of the second region 320 forming the same plane with the first region 310 may be relatively larger.

Figure 13A:
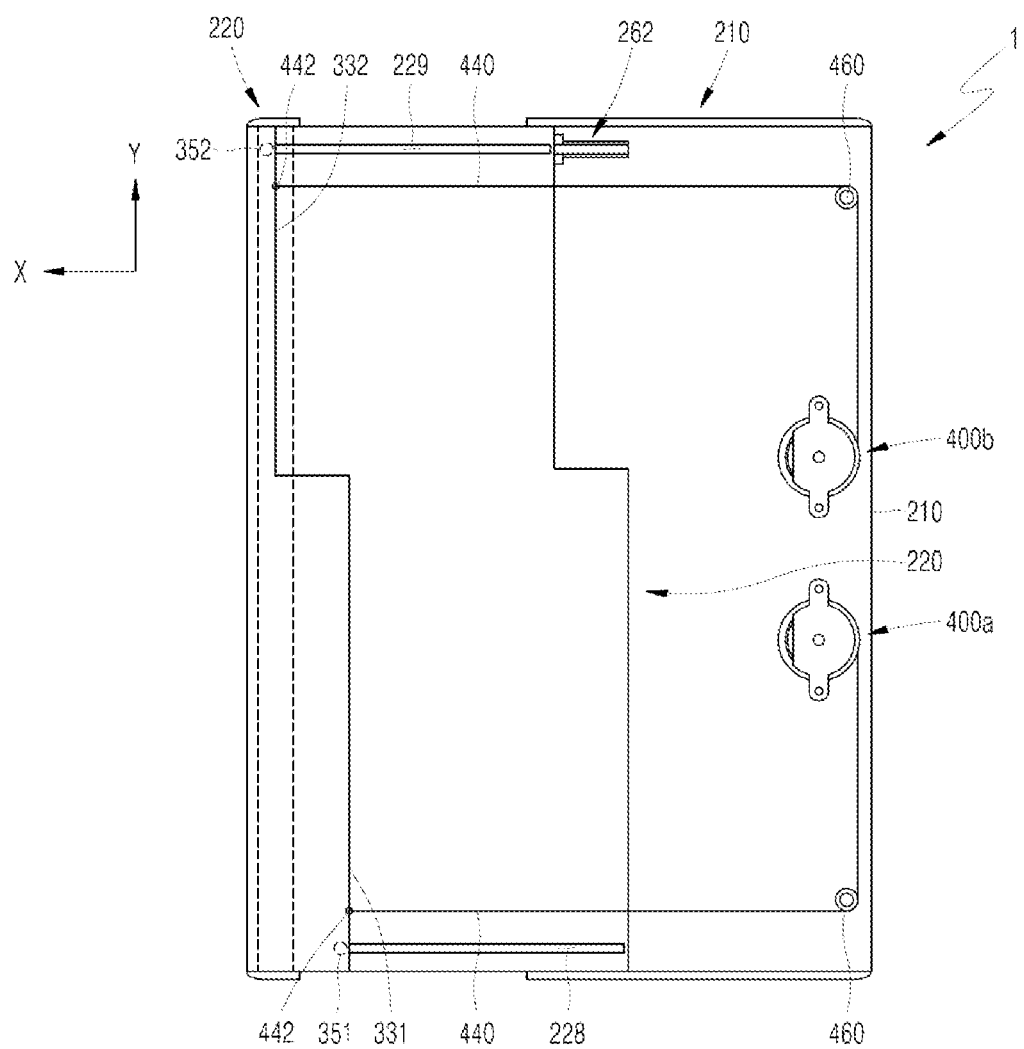
FIG. 13A is a rear view illustrating a flexible display device.
Figure 13B:
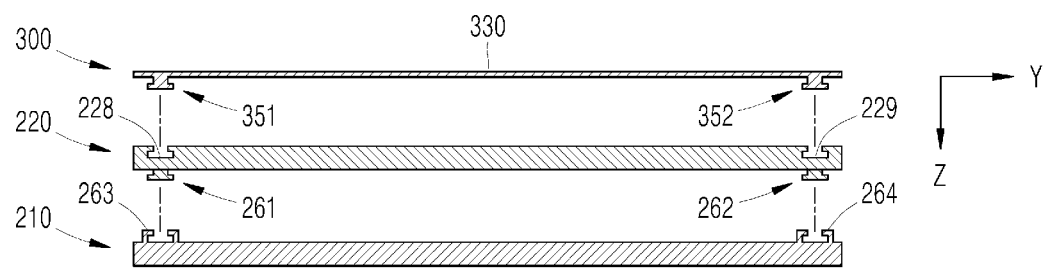
FIG. 13B is a cross-sectional view schematically illustrating a state in which a first body, a second body, and a third region are separated from each other.
Figure 13C:
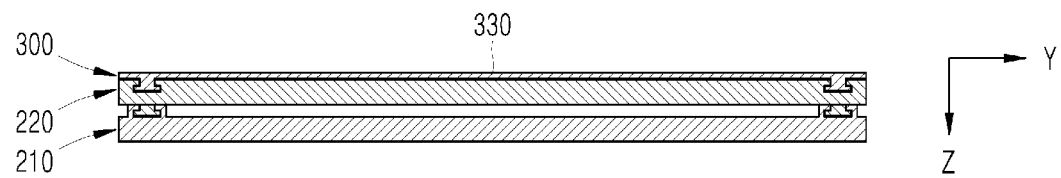
FIG. 13C is a cross-sectional view schematically illustrating a state in which the first body, the second body, and the third region illustrated in FIG. 13B are coupled to each other.

FIG. 13A is a rear view illustrating the flexible display device 1, FIG. 13B is a cross-sectional view schematically illustrating a state in which the first body 210, the second body 220, and the third region 330 are separated from each other, and FIG. 13C is a cross-sectional view schematically illustrating a state in which the first body 210, the second body 220, and the third region 330 illustrated in FIG. 13B are combined.

Figure 14:
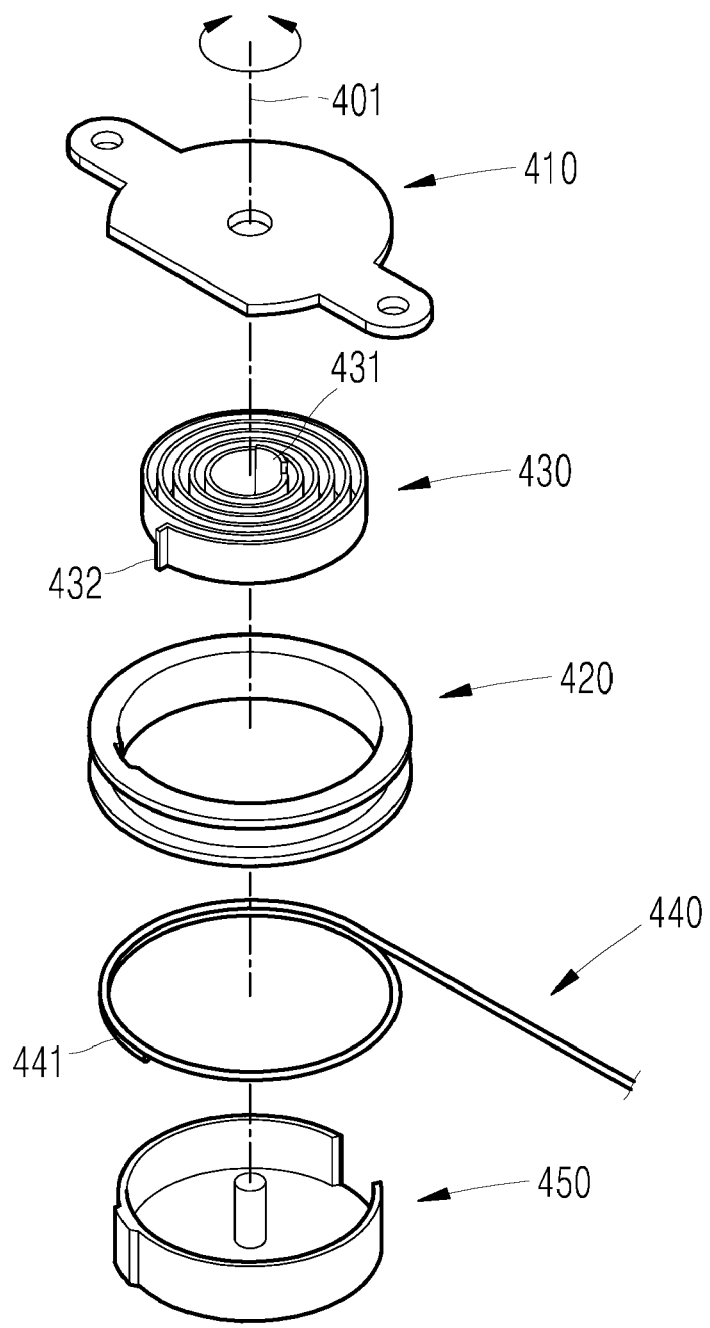
FIG. 14 is an exploded perspective view illustrating a tension generator.

FIG. 14 is an exploded perspective view illustrating the tension generator 400, 400a, and 400b.

In order to enable the second body 220 and the third region 330 of the flexible display 300 to perform relative movement (sliding movement), the flexible display device 1 may be configured to further include a third rail 228, a fourth rail 229, a third slider 351, and a fourth slider 352.

The third rail 228 is configured to extend on the second body 220 in the first direction. The third rail 228 may have a uniform cross-section in the first direction, and may have a groove shape on a rear surface of the second body 220.

The fourth rail 229 extends on the second body 220 in the first direction. The fourth rail 229 may have a uniform cross-section in the first direction, and may have a groove shape on a rear surface of the second body 220.

The third rail 228 and the fourth rail 229 may have the same cross-section.

The third rail 228 and the fourth rail 229 may be spaced apart from each other to be parallel to each other. When the third rail 228 is provided on the lower side of the second body 220, the fourth rail 229 may be provided on the upper side of the second body 220.

The third slider 351 is coupled to the third rail 228 to perform sliding movement in a longitudinal direction of the third rail 228, and is fixed to the flexible display 300. The third slider 351 may be fixed to the third region 330.

When the third rail 228 has a groove shape, the third slider 351 may be inserted into and coupled to the third rail 228 by having a protruding shape, and may be bound to the third rail 228 such that movement of the third slider 351 in a direction other than the first direction is prevented.

The fourth slider 352 is coupled to the fourth rail 229 to perform sliding movement in the longitudinal direction of the fourth rail 229, and is fixed to the flexible display 300. The fourth slider 352 may be fixed to the third region 330.

When the fourth rail 229 has a groove shape, the fourth slider 352 may be inserted into and coupled to the fourth rail 229 by having a protruding shape, and may be bound to the fourth rail 229 such that movement the fourth slider 352 in a direction other than the first direction is prevented.

In the flexible display device 1, the tension generator 400 may include a first tension generator (also referred to as a first tensioner) 400a and a second tension generator (also referred to as a second tensioner) 400b. The first tension generator 400a and the second tension generator 400b may respectively be configured like the tension generator 400 described above.

The first tension generator 400a may be configured to couple the first body 210 to the first end region 331, and when the second body 220 is at the second position, to apply tension to the flexible display 300.

The second tension generator 400b may be configured to couple the first body 210 to the second end region 332, and when the second body 220 is at the second position, to apply tension to the flexible display 300.

The tension generator 400, the first tension generator 400a, and the second tension generator 400b may be configured to include a tension body 410, a spool 420, a spiral spring 430, and a wire 440, respectively.

In addition, the tension generator 400, the first tension generator 400a, and the second tension generator 400b may be configured to include a tension housing 450 for receiving the spiral spring 430, respectively.

Furthermore, the tension generator 400, the first tension generator 400a, and the second tension generator 400b may be configured to include a pulley 460 around which the wire 440 may be wound so as to change the direction of the wire 440.

The tension body 410 is fixed to the first body 210 so as not to rotate relative to the first body 210.

The spool 420 is coupled to the tension body 410 so as to be able to rotate about a rotation axis 401, and the wire 440 is wound around the spool 420.

The spiral spring 430 may be received within the tension housing 450, and have one end 431 fixed to the tension body 410 and the other end 432 fixed to the spool 420. Accordingly, the spiral spring 430 elastically supports the spool 420 on the tension body 410. That is, when the spool 420 is rotated relative to the tension body 410 by applying an external force to the spool 420, the spiral spring 430 is elastically deformed and accordingly stores elastic energy, and when the external force is released, the rotation direction of the spool 420 on the tension body 410 is reversed.

One end 441 of the wire 440 is fixed to and wound around the spool 420 and the other end 442 of the wire 440 is coupled to the third region 330. The wire 440 of the first tension generator 400a is coupled to the first end region 331 of the third region 330, and the wire 440 of the second tension generator 400b is coupled to the second end region 332 of the third region 330.

When an external force is applied to the flexible display device 1 to cause the second body 220 to switch from the first position to the second position relative to the first body 210, the third region 330 is close to the support 230 in the first direction, and the spiral spring 430 is elastically deformed and stores elastic energy accordingly as the wire 440 is unwound from the spool 420. Accordingly, a predetermined tension is applied to the flexible display 300.

When the external force applied to the flexible display device 1 is removed, the wire 440 is again wound around the spool 420 by the elastic restoring force of the spiral spring 430, such that the tension generators 400, 400a, and 400b pull the third region 330 to cause the third region 330 to be close to the camera 122 in the first direction.

Figure 15:
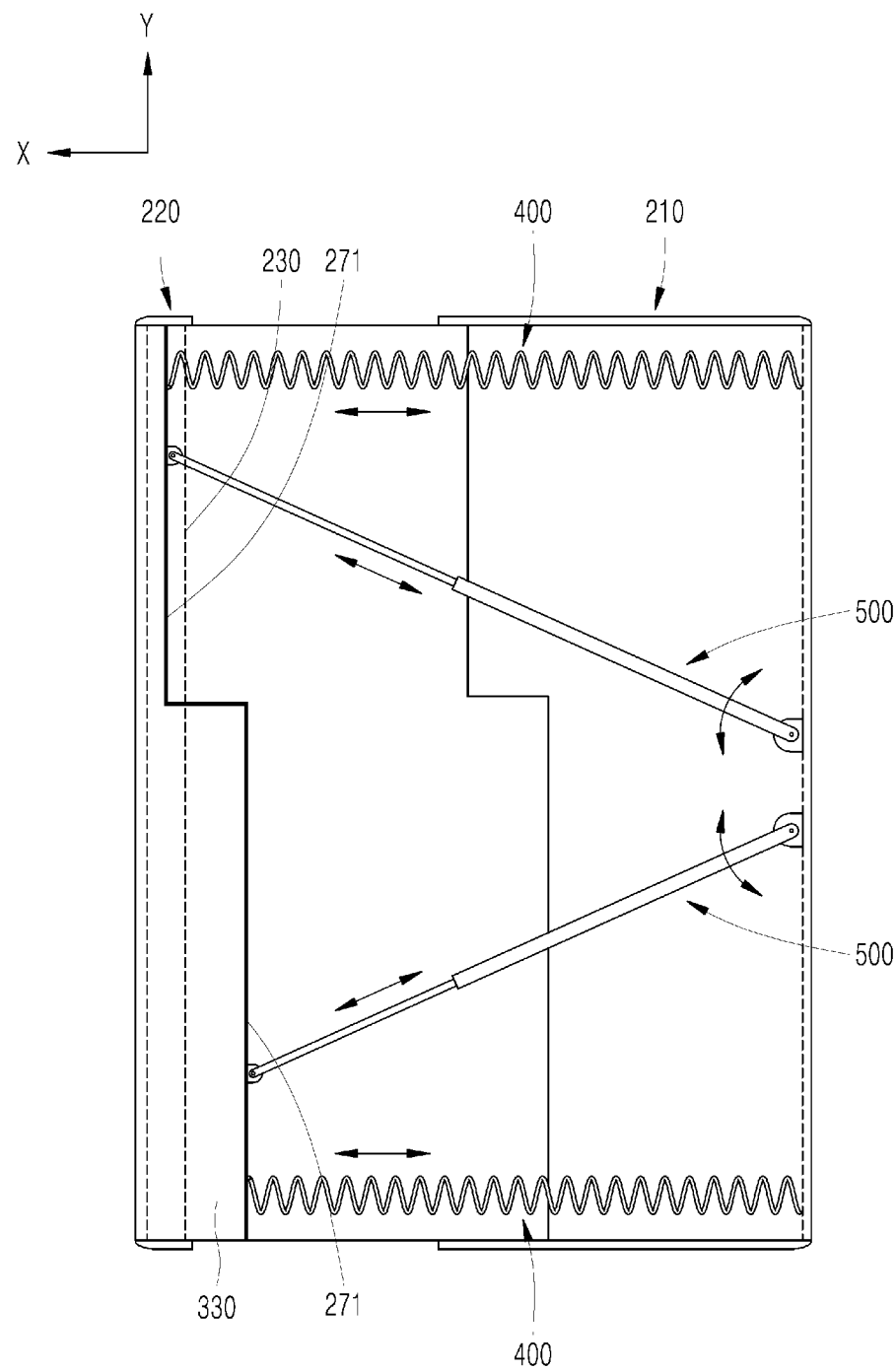
FIG. 15 is a rear view illustrating a flexible display device.
Figure 16A:
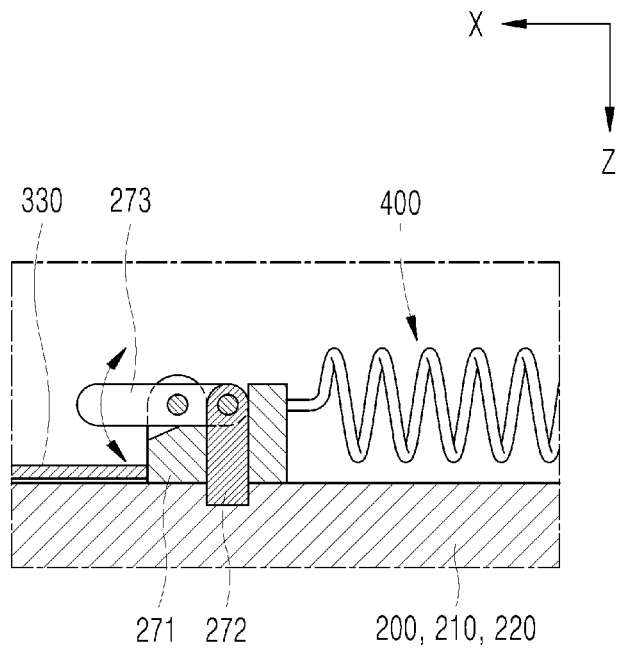
FIGS. 16A and 16B are cross-sectional views illustrating a part of a flexible display device, respectively.
Figure 16B:
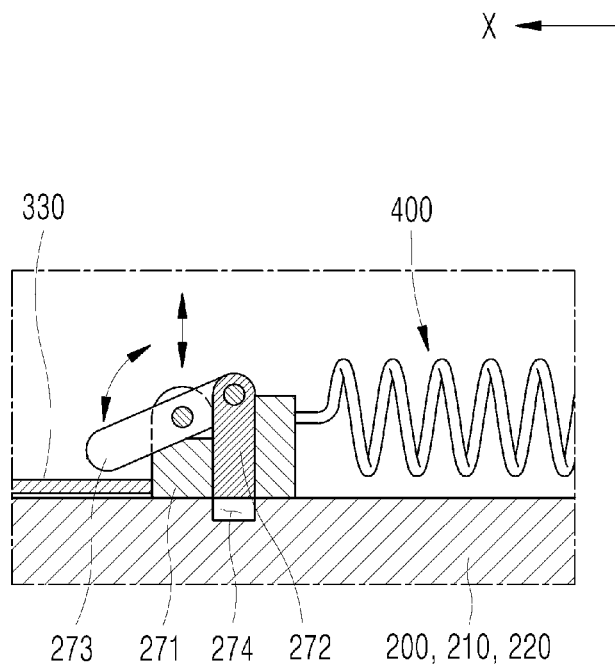

FIG. 15 is a rear view illustrating the flexible display device 1, and FIGS. 16A and 16B are cross-sectional views illustrating a part of the flexible display device 1.

The flexible display device 1 may be configured to further include a hydraulic cylinder 500 having a variable length. The hydraulic cylinder 500 may be configured such that one end thereof is coupled to (or rotatably coupled to) the first body 210 and the other end thereof is coupled to (or rotatably coupled to) the third region 330 of the flexible display 300.

The hydraulic cylinder 500 may be configured to prevent rapid movement (modification) of the flexible display 300 and to allow smooth movement (modification) thereof, when switching from the first position to the second position or vice versa is made, The flexible display device 1 may be configured to further include a coupling beam 271, a stopper 272, and a trigger 273.

The coupling beam 271 is configured to mediate the coupling between the third region 330 and the tension generator 400. The coupling beam 271 may be made of a material that is harder than that of the flexible display 300.

For example, the coupling beam 271 may be made of a material such as plastic, carbon fiber, or metal. The coupling beam 271 may be coupled to an end of the third region 330 in the second direction.

The stopper 272 may be configured to fix the coupling beam 271 to the first body 210 or the second body 220. The stopper 272 may be movably coupled to the coupling beam 271, and a stop hole 274 into which an end of the stopper 272 is inserted may be formed in the first body 210 or the second body 220.

When the stopper 272 is inserted into the stop hole 274 by pressing the stopper 272, movement (movement in the first direction) of the coupling beam 271 relative to the first body 210 or the second body 220 is prevented.

The trigger 273 may be configured to separate the coupling beam 271 and the stopper 272 from the first body 210 or the second body 220. In an embodiment, the trigger 273 may be formed in the shape of a lever. In this case, when the trigger 273 is rotated by pressing of the trigger 273, the stopper 272 inserted into the stop hole is withdrawn therefrom, such that movement (movement in the first direction) of the coupling beam 271 and the stopper 272 relative to the first body 210 may be performed.

In the foregoing, while specific embodiments of the present disclosure have been described for illustrative purposes, the scope or spirit of the present disclosure is not limited thereto, it will be understood by those skilled in the art that various changes and modifications can be made to other specific embodiments without departing from the spirit and scope of the present disclosure. Therefore, the scope of the present disclosure should be defined not by the above-described embodiments but by the technical idea defined in the following claims.

The flexible display device according to the embodiment of the present disclosure is industrially applicable in that it can increase a range (stroke) of movement of the second body relative to the first body and increase the area of the display viewed from the front.

What is claimed is:

1. A flexible display device, comprising:
    a body comprising: a first body, a second body configured to move relative to the first body between a first position and a second position, and a support coupled to the second body, wherein the support and the second body move together relative to the first body;
    a flexible display comprising: a first region disposed at a front of the first body, a second region extending from the first region and partially curved around the support, and a third region extending from the second region; and
    a camera disposed at a rear of the body,
    wherein an area of the second region that is co-planar with the first region is larger when the second body is at the second position than when the second body is at the first position, wherein the camera is located at an outer surface of the first body toward a lateral edge of the flexible display device away from the support, and the camera is adjacent to an edge of the first body farthest from the support,
    wherein the third region comprises a first end region and a second end region that do not interfere with the camera when the second body is at the first position,
    wherein, when the second body is at the first position, the second end region is disposed adjacent to the camera toward a direction in which the second body moves from the first position to the second position, and
    wherein when the second body is at the first position a distance from the support to an end of the first end region is greater than the distance from the support to the camera.

2. The flexible display device according to claim 1, wherein the support is a cylindrical roller aligned orthogonal to a movement direction of the second body relative to the first body.

3. The flexible display device according to claim 2, wherein the support is configured to rotate about a central axis as the second body is moved between the first position and the second position.

4. The flexible display device according to claim 2, wherein the outer surface of the first body and an outer surface of the second body form a rear surface of the flexible display device when the second body is at the second position.

5. The flexible display device according to claim 4, wherein the second and third regions are configured to move between the first body and the second body, and wherein the second body comprises:
    a second transparent region positioned such that the second region is visible therethrough; and
    a second non-transparent region positioned such that the third region is not visible.

6. The flexible display device according to claim 5, further comprising a touch panel disposed at the second transparent region.

7. The flexible display device according to claim 4, wherein, when the second body is at the first position, an inner surface of the first body faces an outer surface of the second body,
    wherein the flexible display device further comprises a wireless transmission/reception part coupled to the inner surface of the first body and positioned to overlap the third region when the second body is at the first position, and
    wherein the wireless transmission/reception part is configured to perform wireless charging or wireless communication.

8. The flexible display device according to claim 1, wherein the second region comprises:
    a first connected region adjacent to the first region; and
    a second connected region between the first connected region and the third region,
    wherein, when the second body is at the first position, the first connected region is curved around the support, and a plane of the second connected region is parallel to a plane of the first region, and
    wherein, when the second body is at the second position, the first connected region is co-planar with the first region, at least a portion of the second connected region is curved around the support, and at least a portion of the third region is curved around the support.

9. The flexible display device according to claim 1, wherein when the second body is at the second position a part of the third region is curved around the support and a plane of a remaining part of the third region is parallel to a plane of the first region.

10. The flexible display device according to claim 1, further comprising a tensioner configured to couple the third region to the first body or the second body, and to provide a tensioning force to the third region away from the support.

11. A flexible display device, comprising:
    a first body;

a second body configured to move relative to the first body between a first position and a second position in a first direction;

a support aligned in a second direction orthogonal to the first direction and coupled to the second body, wherein the support and the second body move together relative to the first body;

a flexible display comprising a first region, a second region, and a third region, wherein the first region is fixed in front of the first body; and a plurality of cameras located at a rear of the first body and toward an edge of the flexible display device away from the support, wherein the plurality of cameras are adjacent to an edge of the first body farthest from the support, wherein the plurality of cameras are adjacent to an edge of the first body farthest from the support, and the plurality of cameras are arranged along the second direction, wherein the third region comprises a first end region and a second end region that do not interfere with the plurality of cameras when the second body is at the first position, wherein when the second body is at the first position, the second end region is disposed adjacent to the plurality of cameras toward the first direction, and wherein when the second body is at the first position a distance from the support to an end of the first end region is greater than or equal to a distance from the support to a center of one of the plurality of cameras.

12. The flexible display device according to claim 11, wherein the second region comprises:
   a first connected region adjacent to the first region; and
   a second connected region between the first connected region and the third region,
   wherein when the second body is at the first position the first connected region is curved around the support, a plane of the second connected region is parallel to a plane of the first region, and the third region is aligned with the plurality of cameras in the second direction, and
   wherein when the second body is at the second position the first connected region is co-planar with the first region, at least a portion of the second connected region is curved around the support, and the third region is aligned with the support in the second direction.

13. The flexible display device according to claim 11, wherein the first end region is aligned with the plurality of cameras in the second direction when the second body is at the first position.

14. The flexible display device according to claim 13, wherein the second body is located behind the first body when the second body is at the first position, and wherein the second body comprises a first support region configured to support the first end region and a second support region configured to support the second end region when the second body is at the first position.

15. The flexible display device according to claim 14, further comprising:
   a first rail configured to extend in the first direction and to be coupled to the first support region;
   a second rail configured to extend in the first direction and to be coupled to the second support region;
   a first slider coupled to the first body and configured to slide along the first rail; and
   a second slider coupled to the first body and configured to slide along the second rail,
   wherein respective distances from the support to respective ends of the first and second rails are greater than a distance from the support to an end of the second support region.

16. The flexible display device according to claim 13, further comprising:
   a first tensioner configured to couple the first body to the first end region and provide a tensioning force to the flexible display when the second body is at the second position; and
   a second tensioner configured to couple the first body to the second end region and provide a tensioning force to the flexible display when the second body is at the second position.

17. The flexible display device according to claim 11, further comprising a tensioner configured to couple the first body to the third region and provide a tensioning force to the flexible display when the second body is at the second position.

18. The flexible display device according to claim 17, wherein the tensioner comprises:
   a tension body coupled to the first body;
   a spool rotatably coupled to the tension body;
   a spiral spring configured to provide an elastic rotational force to the spool; and
   a wire wound around the spool and coupled to the third region.

19. The flexible display device according to claim 17, further comprising:
   a coupling beam wherein the tensioner is coupled to the third region via the coupling beam;
   a stopper configured to engage with the first body to secure movement of the coupling beam; and
   a trigger configured to cause the stopper to be disengaged from the first body to allow movement of the coupling beam.

* * * * *